US012787572B2

(12) United States Patent
Park et al.

(10) Patent No.: US 12,787,572 B2
(45) Date of Patent: Nov. 3, 2026

(54) LIGHT EMITTING DISPLAY DEVICE INCLUDING FLAT ANODE

(71) Applicant: Samsung Display Co., Ltd., Yongin-Si (KR)

(72) Inventors: Hyungkeun Park, Yongin-si (KR); Seokhyun Lim, Yongin-si (KR); Gun Hee Kim, Yongin-si (KR); Joo Hee Jeon, Yongin-si (KR); Sun Young Jung, Yongin-si (KR); Miyeon Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 365 days.

(21) Appl. No.: 18/423,292

(22) Filed: Jan. 26, 2024

(65) Prior Publication Data

US 2025/0017061 A1 Jan. 9, 2025

(30) Foreign Application Priority Data

Jul. 4, 2023 (KR) ........................ 10-2023-0086431

(51) Int. Cl.

| | |
|---|---|
| ***H10K 59/131*** | (2023.01) |
| ***G09G 3/32*** | (2016.01) |
| ***H10K 59/80*** | (2023.01) |

(52) U.S. Cl.

CPC ............. *H10K 59/131* (2023.02); *G09G 3/32* (2013.01); *H10K 59/8791* (2023.02); *G09G 2300/0819* (2013.01); *G09G 2300/0852* (2013.01); *G09G 2310/08* (2013.01)

(58) Field of Classification Search

CPC ........... H10K 59/8791; H10K 59/1216; H10K 59/8051

See application file for complete search history.

(56) References Cited

U.S. PATENT DOCUMENTS

| | | | | |
|---|---|---|---|---|
| 11,563,073 B2 | 1/2023 | Li et al. | | |
| 2011/0147757 A1* | 6/2011 | Kim | H10D 86/481 | 257/E33.001 |
| 2014/0176520 A1 | 6/2014 | Hwang et al. | | |
| 2020/0185489 A1* | 6/2020 | Jo | H10K 59/131 | |
| 2022/0045141 A1 | 2/2022 | Zhang et al. | | |
| 2023/0189564 A1* | 6/2023 | Zhang | H10K 59/1213 | 257/71 |

FOREIGN PATENT DOCUMENTS

| | | |
|---|---|---|
| CN | 109786434 A | 5/2019 |
| CN | 113224120 A | 8/2021 |
| CN | 114586163 A | 6/2022 |

* cited by examiner

*Primary Examiner* — Nduka E Ojeh

(74) *Attorney, Agent, or Firm* — Innovation Counsel LLP

(57) ABSTRACT

According to embodiments, a light emitting display device includes a substrate, a first anode and a second anode positioned on the substrate, a plurality of conductive layers, at least one semiconductor layer, and a plurality of insulating layers positioned between the substrate and the first anode and between the substrate and the second anode, wherein the plurality of conductive layers includes a capacitor triple layer, a first overlapping wiring, and a second overlapping wiring, the first overlapping wiring and the second overlapping wiring overlap at least partially on a plane, at least a portion of the first anode overlaps the capacitor triple layer on a plane, and a first portion of the second anode overlaps the first overlapping wiring and the second overlapping wiring.

20 Claims, 13 Drawing Sheets

LIGHT EMITTING DISPLAY DEVICE INCLUDING FLAT ANODE

CROSS-REFERENCE TO RELATED APPLICATION

This application claims priority to and the benefit of Korean Patent Application No. 10-2023-0086431 filed at the Korean Intellectual Property Office on Jul. 4, 2023, the entire contents of which are incorporated herein by reference.

BACKGROUND OF THE DISCLOSURE

(a) Field of the Disclosure

The present disclosure relates to a light emitting display device.

2. Description of the Related Art

A display device is a device for displaying an image, and includes a liquid crystal display (LCD), an organic light emitting diode (OLED) display, and the like. The display device is used in various electronic devices such as a mobile phone, a navigation device, a digital camera, an electronic book, a portable game machine, and various terminals.

A light emitting display device such as an organic light emitting display may have a structure in which the display device may be bent or folded by using a flexible substrate.

SUMMARY

Embodiments are for reducing a reflection diffraction pattern or a reflection color band generated when an external light is reflected.

A light emitting display device according to an embodiment includes a substrate, a first anode and a second anode positioned on the substrate, a plurality of conductive layers, at least one semiconductor layer, and a plurality of insulating layers positioned between the substrate and the first anode and between the substrate and the second anode, wherein the plurality of conductive layers includes a capacitor triple layer, a first overlapping wiring, and a second overlapping wiring, the first overlapping wiring and the second overlapping wiring overlap at least partially, at least a portion of the first anode overlaps the capacitor triple layer, and a first portion of the second anode overlaps the first overlapping wiring and the second overlapping wiring.

The plurality of conductive layers, the at least one semiconductor layer, and the plurality of insulating layers may include a first semiconductor layer positioned on the substrate; a first gate insulating layer positioned on the first semiconductor layer; a first gate conductive layer positioned on the first gate insulating layer; a second gate insulating layer positioned on the first gate conductive layer; a second gate conductive layer positioned on the second gate insulating layer; a first interlayer insulating layer positioned on the second gate conductive layer; an auxiliary conductive layer positioned on the first interlayer insulating layer; a second interlayer insulating layer positioned on the auxiliary conductive layer; an oxide semiconductor layer positioned on the second interlayer insulating layer; a third gate insulating layer positioned on the oxide semiconductor layer; a third gate conductive layer positioned on the third gate insulating layer; a third interlayer insulating layer positioned on the third gate conductive layer; a first data conductive layer positioned on the third interlayer insulating layer; a first organic layer positioned on the first data conductive layer; a second data conductive layer positioned on the first organic layer; and a second organic layer positioned on the second data conductive layer.

The capacitor triple layer may include a driving gate electrode included in the first gate conductive layer; a second storage electrode included in the second gate conductive layer, and a first hold electrode included in the auxiliary conductive layer, and at least a part of the driving gate electrode, at least a part of the second storage electrode, and at least a part of the first hold electrode may overlap each other.

The first anode and the second anode may overlap with the second data conductive layer.

The first anode and the second anode may overlap with a driving voltage line positioned in the second data conductive layer.

The first overlapping wiring may be positioned in one conductive layer among the first gate conductive layer, the second gate conductive layer, the auxiliary conductive layer, the third gate conductive layer, and the first data conductive layer, and the second overlapping wiring may be positioned in a conductive layer different from the first overlapping wiring as one conductive layer among the first gate conductive layer, the second gate conductive layer, the auxiliary conductive layer, the third gate conductive layer, and the first data conductive layer.

The plurality of conductive layers may further include a third overlapping wiring, the third overlapping wiring may overlap the first overlapping wiring and the second overlapping wiring at least partially, and the third overlapping wiring may be one conductive layer among the first gate conductive layer, the second gate conductive layer, the auxiliary conductive layer, the third gate conductive layer, and the first data conductive layer, and be positioned in a conductive layer different from the first overlapping wiring and the second overlapping wiring.

The first overlapping wiring may be a repair line positioned in the second gate conductive layer, the second overlapping wiring may be a lower second initialization voltage line positioned in the auxiliary conductive layer, and the third overlapping wiring may be an upper second initialization voltage line positioned in the third gate conductive layer.

The plurality of conductive layers may further include a fourth overlapping wiring, a fifth overlapping wiring, and a sixth overlapping wiring, the fourth overlapping wiring, the fifth overlapping wiring and the sixth overlapping wiring may overlap each other at least partially, and a second portion of the second anode may overlap with the fourth overlapping wiring, the fifth overlapping wiring, and the sixth overlapping wiring.

The fourth overlapping wiring may be a third scan line positioned in the first gate conductive layer, the fifth overlapping wiring may be a first initialization voltage line positioned in the second gate conductive layer, and the sixth overlapping wiring may be a first scan line positioned in the third gate conductive layer.

The first overlapping wiring may be a third scan line positioned in the first gate conductive layer, the second overlapping wiring may be a first initialization voltage line positioned in the second gate conductive layer, and the third overlapping wiring may be a first scan line positioned in the third gate conductive layer.

A light emitting display device according to an embodiment includes a substrate, a first anode positioned in the substrate, and a plurality of conductive layers, at least one semiconductor layer, and a plurality of insulating layers positioned between the substrate and the first anode, wherein the plurality of conductive layers includes a capacitor triple layer, a first overlapping wiring, and a second overlapping wiring, the first overlapping wiring and the second overlapping wiring overlap at least partially, at least a first portion of the first anode overlaps the capacitor triple layer, and at least a second portion of the first anode overlaps the first overlapping wiring and the second overlapping wiring.

The plurality of conductive layers, the at least one semiconductor layer, and the plurality of insulating layers may include a first semiconductor layer positioned on the substrate; a first gate insulating layer positioned on the first semiconductor layer; a first gate conductive layer positioned on the first gate insulating layer; a second gate insulating layer positioned on the first gate conductive layer; a second gate conductive layer positioned on the second gate insulating layer; a first interlayer insulating layer positioned on the second gate conductive layer; an auxiliary conductive layer positioned on the first interlayer insulating layer; a second interlayer insulating layer positioned on the auxiliary conductive layer; an oxide semiconductor layer positioned on the second interlayer insulating layer; a third gate insulating layer positioned on the oxide semiconductor layer; a third gate conductive layer positioned on the third gate insulating layer; a third interlayer insulating layer positioned on the third gate conductive layer; a first data conductive layer positioned on the third interlayer insulating layer; a first organic layer positioned on the first data conductive layer; a second data conductive layer positioned on the first organic layer; and a second organic layer positioned on the second data conductive layer.

The capacitor triple layer may include a driving gate electrode included in the first gate conductive layer; a second storage electrode included in the second gate conductive layer; and a first hold electrode included in the auxiliary conductive layer; wherein at least a portion of the driving gate electrode, at least a portion of the second storage electrode; and at least a portion of the first hold electrode may overlap each other.

An entirety of the first anode may overlap the second data conductive layer.

An entirety of the first anode may overlap a driving voltage line located in the second data conductive layer.

The first overlapping wiring may be positioned in a conductive layer among the first gate conductive layer, the second gate conductive layer, the auxiliary conductive layer, the third gate conductive layer, and the first data conductive layer, and the second overlapping wiring may be a conductive layer among the first gate conductive layer, the second gate conductive layer, the auxiliary conductive layer, the third gate conductive layer, and the first data conductive layer, and be positioned in a conductive layer different from the first overlapping wiring.

The plurality of conductive layers may further include a third overlapping wiring, the third overlapping wiring may overlap the first overlapping wiring and the second overlapping wiring at least partially, and the third overlapping wiring may be a conductive layer among the first gate conductive layer, the second gate conductive layer, the auxiliary conductive layer, the third gate conductive layer, and the first data conductive layer, and be positioned in the conductive layer different from the first overlapping wiring and the second overlapping wiring.

Two of the first overlapping wiring, the second overlapping wiring, and the third overlapping wiring may receive the same voltage or signal.

The first overlapping wiring may be a lower first initialization voltage line positioned in the first gate conductive layer, the second overlapping wiring may be an upper first initialization voltage line positioned in the second gate conductive layer, and the third overlapping wiring may be a second/first scan line positioned in the third gate conductive layer.

According to an embodiment, as a polarizer is not formed on a front surface, even if an incident external light is reflected from the anode, the flatness of the anode may be improved to prevent the reflected light from spreading asymmetrically, thereby the display quality may be improved by reducing the reflection diffraction pattern or the reflection color band phenomenon caused by the reflected light.

In addition, by positioning three conductive layers under the anode, there is no height difference for the anode overlapping two capacitors, and it is flattened so that the reflected light does not spread asymmetrically.

In addition, instead of a polarizer, as a black pixel definition layer is used as a pixel definition layer that separates the light emitting layers from each other, a ratio at which an external light is reflected may be reduced.

DETAILED DESCRIPTION

Figure 1:
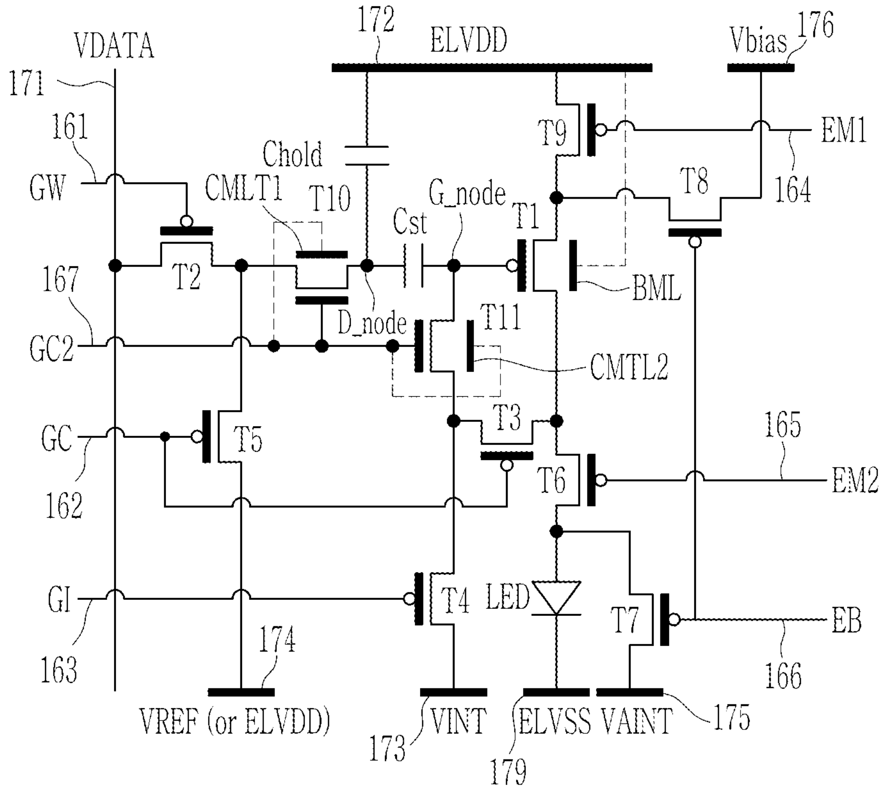
FIG. 1 is an equivalent circuit diagram of one pixel included in a light emitting display device according to an embodiment.

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

In order to clarify the present invention, parts that are not connected with the description will be omitted, and the same elements or equivalents are referred to by the same reference numerals throughout the specification.

Further, since the sizes and thicknesses of constituent members shown in the accompanying drawings are arbitrarily given for better understanding and ease of description, the present invention is not limited to the illustrated sizes and thicknesses. In the drawings, the thickness of layers, films, panels, regions, etc., is exaggerated for clarity. In the drawings, for better understanding and ease of description, thicknesses of some layers and areas are excessively displayed.

It should be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise," and variations such as "comprises" or "comprising," should be understood to imply the inclusion of stated elements but not the exclusion of any other elements.

Further, in the specification, the phrase "on a plane" means when an object portion is viewed from above, and the phrase "on a cross-section" means when a cross-section taken by vertically cutting an object portion is viewed from the side.

In addition, in the specification, the expression "connected to" does not only mean that two or more constituent elements are directly connected, but that two or more constituent elements are electrically connected through other constituent elements as well as being indirectly connected and being physically connected, or it may mean that they are referred to by different names according to a position or function, but are integrated.

Also, throughout the specification, when it is said that parts such as a wire, a layer, a film, a region, a plate, and a constituent element "extend in a first direction or a second direction," this does not mean only a straight line shape extending linearly in the corresponding direction, but also includes a structure that is bent in a part, has a zigzag structure, or is curved while generally extending in the first direction or the second direction.

In addition, electronic devices (e.g., a mobile phone, a TV, a monitor, a laptop computer) included in display devices and display panels described in the specification, or electronic devices included in display devices and display panels, etc. manufactured by manufacturing methods described in the specification, are not excluded from the scope of this specification.

Hereinafter, a circuit structure of one pixel among a light emitting display device according to an embodiment is described with reference to FIG. 1.

FIG. 1 is an equivalent circuit diagram of one pixel included in a light emitting display device according to an embodiment.

Referring to FIG. 1, one pixel includes a light emitting diode LED and a pixel circuit unit for driving the light emitting diode LED, and the pixel circuit unit is arranged in a matrix type. The pixel circuit unit includes all other elements except the light emitting diode LED in FIG. 1, and the pixel circuit unit of the pixel according to the embodiment of FIG. 1 includes a driving transistor T1, a second transistor T2, a third transistor T3, a fourth transistor T4, a fifth transistor T5, a sixth transistor T6, a seventh transistor T7, an eighth transistor T8, a ninth transistor T9, a tenth transistor T10, an eleventh transistor T11, a storage capacitor Cst, and a hold capacitor Chold. Also, the pixel circuit unit is connected to a first scan line 161 to which a first scan signal GW is applied, a second scan line 162 to which a second scan signal GC is applied, a second/first scan line 167 to which a second scan signal GC2 corresponding to the second scan signal GC is applied, a third scan line 163 to which a third scan signal GI is applied, a light emission signal line 164 to which emission signals EM1 and EM2 are applied, and a light emission signal line 165, a fourth scan line 166 to which a fourth scan signal EB is applied, and a data line 171 to which a data voltage VDATA is applied. Also, the pixel may receive a driving voltage ELVDD (hereinafter referred to as a first driving voltage), a driving low voltage ELVSS (hereinafter referred to as a second driving voltage), a first initialization voltage VINT, a second initialization voltage VAINT, a reference voltage VREF, and a bias voltage Vbias through the driving voltage line 172, the driving low voltage line 179, the first initialization voltage line 173, the second initialization voltage line 175, the reference voltage line 174, and the bias voltage line 176, respectively.

The structure of the pixel is described as follows, focusing on each element (a transistor, a capacitor, and a light emitting diode) included in the pixel.

The driving transistor T1 includes a gate electrode (hereinafter referred to as a driving gate electrode) connected to a first electrode of the storage capacitor Cst, a first electrode (an input-side electrode) connected to the driving voltage ELVDD through a ninth transistor T9, and a second electrode (an output-side electrode) that outputs a current according to the voltage of the driving gate electrode.

The gate electrode of the driving transistor (T1; hereinafter also referred to as a first transistor) is connected to the second electrode (an output side electrode) of the eleventh transistor T11 and the first electrode of the storage capacitor Cst. The first electrode of the driving transistor T1 is connected to the second electrode (an output side electrode) of the ninth transistor T9 and the second electrode (an output side electrode) of the eighth transistor T8 to receive the driving voltage ELVDD and/or the bias voltage Vbias, and the second electrode of the driving transistor T1 is connected to the first electrode (an input side electrode) of the third transistor T3 and the first electrode (an input side electrode) of the sixth transistor T6. The output current of the driving transistor T1 passes through the sixth transistor T6, and is transmitted to the light emitting diode LED so that the light emitting diode LED emits light. The luminance of the light emitted by the light emitting diode LED is determined according to the magnitude of the output current of the driving transistor T1. Meanwhile, the driving transistor T1 may further include an overlapping electrode BML overlapping at least a part (e.g., a channel) of a semiconductor (e.g., a polycrystalline semiconductor) of the driving transistor. FIG. 1 illustrates that the overlapping electrode BML may be connected to the driving voltage line 172 to apply the driving voltage ELVDD, using a broken line. This connection in broken line shows that the connection is just an option. In some embodiments, the overlapping electrode BML may not be connected to the driving voltage line 172, and may be connected another part (e.g., the first electrode or second electrode of the driving transistor T1, or another voltage line).

The second transistor (T2; hereinafter also referred to as a data input transistor) includes a gate electrode connected to the first scan line 161 to which the first scan signal GW is applied, a first electrode (an input side electrode) connected to the data line 171 to which the data voltage VDATA is applied, and a second electrode (an output side electrode) connected to the second electrode of the fifth transistor T5 and the first electrode of the tenth transistor T10. The second transistor T2 inputs the data voltage VDATA into the pixel according to the first scan signal GW so as to be stored in the second electrode of the storage capacitor Cst through the tenth transistor T10.

The third transistor (T3; hereinafter also referred to as a first compensation transistor) includes a gate electrode connected to the second scan line 162 to which the second scan signal GC is applied, a first electrode (an input side electrode) connected to the second electrode of the driving transistor T1 and the first electrode of the sixth transistor T6, and a second electrode (an output side electrode) connected to the first electrode of the eleventh transistor T11 and the second electrode of the fourth transistor T4. The third transistor T3 forms a compensation path that compensates for the threshold voltage of the driving transistor T1 together with the eleventh transistor (T11; hereinafter also referred to as the second compensation transistor) so that the threshold voltage of the driving transistor T1 may be stored in the first electrode of the storage capacitor Cst to be compensated. As a result, even if the threshold voltage of the driving transistor T1 included in each pixel is different, the driving transistor T1 may output the constant output current according to the applied data voltage VDATA.

The fourth transistor (T4; hereinafter referred to as a first initialization transistor) includes a gate electrode connected to the third scan line 163 to which the third scan signal GI is applied, a first electrode receiving the first initialization voltage VINT, and a second electrode connected to the second electrode of the third transistor T3 and the first electrode of the eleventh transistor T11. The fourth transistor T4 functions initializing the second electrode of the third transistor T3 and the first electrode of the eleventh transistor T11 to the first initialization voltage VINT by transmitting the first initialization voltage VINT into the pixel, and if the eleventh transistor T11 is turned on in the following period, the gate electrode of the driving transistor T1 connected to the eleventh transistor T11 and the first electrode of the storage capacitor Cst—that is, a gate node (a G node)—may be initialized.

The fifth transistor (T5; hereinafter also referred to as a data node initialization transistor) includes a gate electrode connected to the second scan line 162 to which the second scan signal GC is applied, a first electrode receiving the reference voltage VREF, and a second electrode connected to the first electrode of the tenth transistor T10 and the second electrode of the second transistor T2. The fifth transistor T5 serves to change each of the second electrode of the storage capacitor Cst, and the second electrode of the hold capacitor Chold to be initialized into the reference voltage VREF through the tenth transistor T10. Meanwhile, according to an embodiment, the driving voltage ELVDD may be applied to the first electrode of the fifth transistor T5 instead of the reference voltage VREF.

The sixth transistor (T6; hereinafter also referred to as a current transmission transistor) includes a gate electrode connected to the second light emission signal line 165 to which the second light emission signal EM2 is applied, a first electrode (an input side electrode) connected to the second electrode of the driving transistor T1 and the first electrode of the third transistor T3, and a second electrode (an output side electrode) connected to the anode of the light emitting diode LED and the second electrode of the seventh transistor T7. The sixth transistor T6 serves to transmit or block the output current of the driving transistor T1 to the light emitting diode LED based on the second light emission signal EM2.

The seventh transistor (T7; hereinafter also referred to as an anode initialization transistor) includes a gate electrode connected to the fourth scan line 166 to which the fourth scan signal EB is applied, a first electrode receiving the second initialization voltage VAINT, and a second electrode connected to the anode of the light emitting diode LED and the second electrode of the sixth transistor T6. The seventh transistor T7 serves to initialize the anode of the light emitting diode LED into the second initialization voltage VAINT. According to an embodiment, the seventh transistor T7 may be an oxide transistor including an oxide semiconductor, and may be turned on by a high-level voltage and turned off by a low-level voltage. In addition, according to an embodiment, the gate electrode of the seventh transistor T7 may be connected to a separate signal line other than the fourth scan line 166—for example, one among the light emission signal lines 164 and 166 to which the light emission signals EM1 and EM2 are applied.

The eighth transistor (T8; hereinafter referred to as a bias transistor) includes a gate electrode connected to the fourth scan line 166 to which the fourth scan signal EB is applied, a first electrode receiving the bias voltage Vbias, and a second electrode connected to the first electrode of the driving transistor T1 and the second electrode of the ninth transistor T9. The eighth transistor T8 may transmit the bias voltage Vbias to the first electrode of the driving transistor T1 so that the characteristic of the driving transistor T1 may be kept constant. For example, if the bias voltage Vbias is transmitted to the first electrode of the driving transistor T1, even if the driving transistor T1 does not receive a separate data voltage VDATA, the output current may be constantly generated with the previously received data voltage VDATA. This operation may serve to maintain the characteristics of the driving transistor T1 during high-speed driving or low-speed driving.

The ninth transistor (T9; hereinafter also referred to as a driving voltage transmission transistor) includes a gate electrode connected to the first light emission signal line 164 to which the first light emission signal EM1 is applied, a first electrode (an input side electrode) receiving the driving voltage ELVDD, and a second electrode (an output side electrode) connected to the first electrode of the driving transistor T1 and the second electrode of the eighth transistor T8. The ninth transistor T9 may transmit the driving voltage ELVDD to the first electrode of the driving transistor T1 so that the driving transistor T1 may generate a current.

The tenth transistor (T10; hereinafter also referred to as a data voltage transmission transistor) includes a gate electrode connected to the second/first scan line (167; hereinafter referred to as an oxide transistor scan line) to which the second/first scan signal GC2 is applied, a first electrode connected to the second electrode of the second transistor T2 and the second electrode of the fifth transistor T5, and a second electrode connected to the second electrode of the storage capacitor Cst and the second electrode of the hold capacitor Chold. The tenth transistor T10 serves to change the voltage of the gate electrode of the driving transistor T1 by transmitting the data voltage VDATA to the second electrode of the storage capacitor Cst; additionally, depending on the timing, the reference voltage VREF may be transmitted to the second electrode of the storage capacitor Cst. Here, the node to which the second electrode of the storage capacitor Cst and the second electrode of the hold capacitor Chold are connected is a node to which the data voltage VDATA is transmitted, and therefore it is also referred to as a data node (D node). Meanwhile, the tenth transistor T10 may further include a first auxiliary electrode CMTL1 overlapping at least a part (e.g., a channel) of a semiconductor (e.g., an oxide semiconductor) of the tenth transistor T10. FIG. 1 shows the first auxiliary electrode CMTL1 connected to the second/first scan line 167 with a broken line. The connection with a broken line indicates that the first auxiliary electrode CMTL1 is not connected to the second/first scan line 167 of the current stage and may be connected to another part (e.g., any one voltage line or the second/first scan line 167 of the previous or next stage). This will be described in more detail in reference to FIG. 17 to FIG. 23.

The eleventh transistor (T11; hereinafter also referred to as the second compensation transistor) includes a gate electrode connected to the second/first scan line 167 to which the second/first scan signal GC2 is applied, a first electrode connected to the second electrode of the third transistor T3 and the second electrode of the fourth transistor T4, and a second electrode connected to the gate electrode of the driving transistor T1 and the first electrode of the storage capacitor Cst. The eleventh transistor T11 together with the third transistor T3 may form the compensation path that compensates for the threshold voltage of the driving transistor T1, so that the threshold voltage of the driving transistor T1 may be stored in the first electrode of the storage capacitor Cst to be compensated. As a result, even if the threshold voltage of the driving transistor T1 included in each pixel is different, the driving transistor T1 may output the constant output current according to the applied data voltage VDATA. Meanwhile, the eleventh transistor T11 may further include a second auxiliary electrode CMTL2 overlapping at least a part (e.g., a channel) of a semiconductor (e.g., oxide semiconductor) of the eleventh transistor T11. FIG. 1 illustrates the second auxiliary electrode CMTL2 connected to the second/first scan line 167 and/or the gate electrode of the eleventh transistor (T11; hereinafter also referred to as a gate sync) as a broken line. The connection with a broken line indicates that it is not connected to the second/first scan line 167 of the current stage and may be connected to another part (e.g., any one voltage line or the second/first scan line 167 of the previous or next stage). This is described with reference to FIG. 17 to FIG. 23.

In the embodiment of FIG. 1, all transistors may be divided into p-type transistors formed using polycrystalline semiconductors and n-type transistors formed using oxide semiconductors. Referring to FIG. 1, the driving transistor T1, the second transistor T2, the third transistor T3, the fourth transistor T4, the fifth transistor T5, the sixth transistor T6, the seventh transistor T7, the eighth transistor T8, and the ninth transistor T9 are polycrystalline transistors including the polycrystalline semiconductor, and the tenth transistor T10 and the eleventh transistor T11 are oxide transistors including the oxide semiconductor. Also, in the embodiment of FIG. 1, the polycrystalline transistor is the p-type transistor that may be turned on by a low-level voltage and turned off by a high-level voltage. On the other hand, the oxide transistor is an n-type transistor and may be turned on by a high-level voltage and turned off by a low-level voltage. According to an embodiment, the seventh transistor T7 may be the oxide transistor including the oxide semiconductor, and may be turned on by a high-level voltage and turned off by a low-level voltage.

The storage capacitor (Cst, hereinafter also referred to as a voltage transmission capacitor) includes a first electrode (hereinafter also referred to as a first storage electrode) connected to the gate electrode of the driving transistor T1 and the second electrode of the eleventh transistor T11—that is, the gate node (G node)—and a second electrode (hereinafter also referred to as a second storage electrode) connected to the second electrode of the tenth transistor T10 and the second electrode of the hold capacitor Chold—that is, the data node (D node). The storage capacitor Cst receives the data voltage VDATA through the second transistor T2 and the tenth transistor T10, or the reference voltage VREF through the fifth transistor T5 and the tenth transistor T10 in order to change the voltage of the gate electrode of the driving transistor T1 and maintain the transmitted voltage until the next voltage is transmitted. In the pixel of the present embodiment, the data voltage VDATA is not directly transmitted to the gate electrode of the driving transistor T1, but is transmitted through the storage capacitor Cst. This is a method of indirectly transmitting the data voltage VDATA to the gate electrode of the driving transistor T1 due to the fact that when the voltage of the second electrode of the storage capacitor Cst suddenly rises, the voltage of the first electrode of the other electrode also rises. According to this method, even if a leakage occurs in at least one transistor (e.g., the second transistor T2) among the transistors included in the pixel, the voltage of the gate electrode of the driving transistor T1 does not directly leak, minimizing any negative effect from the leakage. In addition, in the present embodiment, the data voltage VDATA passes through the storage capacitor Cst without passing through other electrodes of the driving transistor T1 and is directly transmitted to the gate electrode of the driving transistor T1; even if there is a difference in the driving voltage ELVDD according to the position of the pixel, there is also merit in determining the voltage stored in the storage capacitor Cst without affecting the difference.

The hold capacitor Chold includes a first electrode (hereinafter also referred to as a first hold electrode) receiving the driving voltage ELVDD and a second electrode (hereinafter also referred to as a second hold electrode) connected to the second electrode of the storage capacitor Cst and the second electrode of the tenth transistor T10—that is, the data node (D node)—and serves to keep the voltage of the second electrode of the storage capacitor Cst—that is, the voltage of the data node (D node)—constant. That is, according to the hold capacitor Chold, the voltage of the second electrode of the storage capacitor Cst—that is, the data node (D node)—does not change and may have constant voltage even when the surrounding signal changes.

The light emitting diode LED includes the anode connected to the second electrode of the sixth transistor T6 and the second electrode of the seventh transistor T7, and a cathode connected to the driving low voltage ELVSS. The light emitting diode LED may emit light with luminance corresponding to the current supplied from the pixel circuit unit (actually, the driving transistor T1) by being positioned between the pixel circuit unit and the driving low-voltage ELVSS. The light emitting diode LED may include a light emitting layer including at least one of an organic light emission material and an inorganic light emission material. Holes and electrons are injected into the light emitting layer from the anode and the cathode, respectively, and a light emission occurs when the exciton combined with the injected holes and electrons falls from an excited state to a ground state. The light emitting diode LED may emit light of one of the primary colors or a white light. Examples of the primary colors include three primary colors of red, green, and blue. Another example of the primary colors includes yellow, cyan, and magenta. According to an embodiment, a color display characteristic may be improved by further including an additional color filter or a color conversion layer.

In the pixel according to the embodiment of FIG. 1, on a path (hereinafter referred to as a data voltage transmission path) on which the data voltage VDATA is transmitted to the driving gate electrode 1151, two transistors (the second transistor T2 and the tenth transistor T10) and the storage capacitor Cst are positioned. That is, the storage capacitor Cst and the tenth transistor T10 are positioned between the driving gate electrode of the driving transistor T1 and the second transistor T2. At this time, the data voltage VDATA is not directly transmitted to the driving gate electrode of the driving transistor T1, but is transmitted to the second storage electrode of the storage capacitor Cst. When the voltage of the second storage electrode is changed while the data voltage VDATA is applied to the second storage electrode, the data voltage VDATA is indirectly transmitted while the voltage of the first storage electrode and the voltage of the driving gate electrode are changed. The transmission of the data voltage VDATA is applied as two transistors (the second transistor T2 and the tenth transistor T10) are turned on together. In addition, the tenth transistor T10 has a different characteristic from the driving transistor T1 and the second transistor T2, and the two transistors included in the data voltage transmission path have different characteristics. That is, the driving transistor T1 and the second transistor T2 are formed of a p-type polycrystalline transistor, but the tenth transistor T10 is formed of an n-type oxide transistor. Also, as will be described in FIG. 17 to FIG. 23 later, the tenth transistor T10 adjusts the voltage applied to the first auxiliary electrode CMTL1 to adjust the characteristic of the tenth transistor T10 so that the data voltage VDATA may be sufficiently changed to the storage capacitor Cst even during a short time, thereby improving the display quality of the light emitting display device.

The pixel according to the embodiment of FIG. 1 further includes the hold capacitor Chold in addition to the storage capacitor Cst to keep the voltage of the data node (D node)—that is, the data voltage VDATA input to the pixel—more constant. Referring to FIG. 3 to FIG. 16 described later, the driving gate electrode of the driving transistor T1, the storage capacitor Cst, and the hold capacitor Chold may be formed while being overlapped on a plane.

In the pixel according to the embodiment of FIG. 1, two transistors (the third transistor T3 and the eleventh transistor T11) are formed on the compensation path of compensating the threshold voltage of the driving transistor T1, and two transistors (the third transistor T3 and the eleventh transistor T11) must be turned on together to compensate the threshold voltage of the driving transistor T1. In addition, the eleventh transistor T11 has a different characteristic from the driving transistor T1 and the third transistor T3, and the two transistors included in the compensation path have different characteristics. That is, the driving transistor T1 and the third transistor T3 are formed of a p-type polycrystalline transistor, but the eleventh transistor T11 is formed of an n-type oxide transistor. Also, the eleventh transistor T11, as described in FIG. 17 to FIG. 23 later, adjusts the voltage applied to the second auxiliary electrode CMTL2 to adjust the characteristics of the eleventh transistor T11 so that the compensation operation is possible even for a short time, thereby improving the display quality of the light emitting display device even in high-speed driving.

Figure 2:
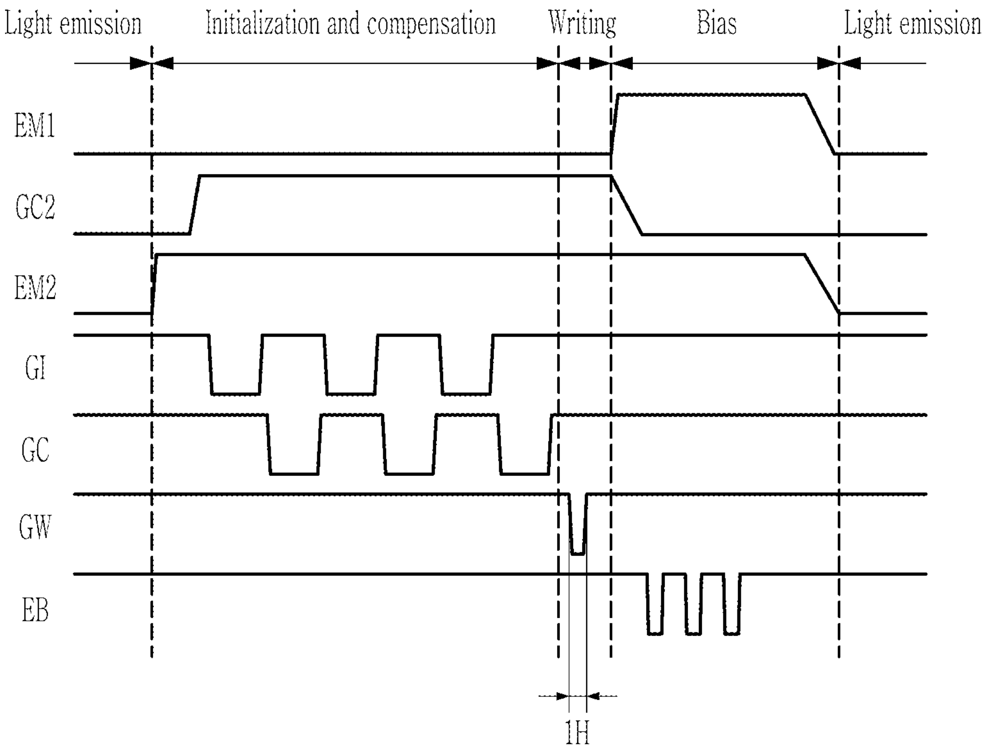
FIG. 2 is a waveform diagram showing a signal applied to a pixel of FIG. 1.

In the following, the operation of the pixel, in which the signal of the waveform of FIG. 2 is applied to the pixel of FIG. 1, is described in detail.

FIG. 2 is a waveform diagram showing a signal applied to a pixel of FIG. 1.

Referring to FIG. 2, if the signal applied to the pixel is divided into sections, they are divided into an initialization and compensation section, a writing section, a bias section, and a light emission section.

First, the light emission section is a section where a light emitting diode LED emits light, a gate-on voltage (a voltage of a low level) is applied to first and second light emission signals EM1 and EM2 to turn on a sixth transistor T6 and a ninth transistor T9. The driving voltage ELVDD is applied to the driving transistor T1, an output current is generated according to the voltage of the driving gate electrode (or the first storage electrode), and the output current of the driving transistor T1 passes through the turned-on sixth transistor T6 and is transmitted to the light emitting diode LED. Therefore, in the light emission section, the light emitting diode LED emits light according to the magnitude of the transmitted output current. In FIG. 2, the light emission section where the light emission signal applies the gate-on voltage (a low-level voltage) is hardly shown, but in reality, the light emission section has the longest time. However, the light emission section performs only the simple operation as above, so it is shown simply in FIG. 2.

If the light emission section ends, the initialization and compensation section begins. Here, in the initialization and compensation section, some electrodes and nodes are initialized while other electrodes and nodes perform a compensation operation.

The light emission section ends as the second light emission signal EM2 is changed into the gate-off voltage (a high-level voltage). The sixth transistor T6 to which the second light emission signal EM2 is applied, is changed into a turned-off state, and the ninth transistor T9, to which the first light emission signal EM1 is applied, is maintained with the turned-on state, and the driving voltage ELVDD is continuously applied to the first electrode of the driving transistor T1. The section to which the gate-off voltage of the second light emission signal EM2 is applied includes an initialization and compensation section, a writing section, and a bias section.

After changing to the gate-off voltage of the second light emission signal EM2, the second/first scan signal GC2 is changed to the gate-on voltage (a high-level voltage), and the third scan signal GI is changed to the gate-on voltage (a low-level voltage). As a result, the tenth transistor T10 and the eleventh transistor T11 receiving the second/first scan signal GC2 are turned on, and the fourth transistor T4 receiving the third scan signal GI is turned on.

By the turned-on fourth transistor T4, the first initialization voltage VINT is transmitted to the second electrode of the third transistor T3 and the first electrode of the eleventh transistor T11 connected to the second electrode of the fourth transistor T4. At this time, since the eleventh transistor T11 is also turned on, the first initialization voltage VINT is transmitted to the gate node (G node), and then the driving gate electrode of the driving transistor T1 and the first storage electrode of the storage capacitor Cst are also initialized into the first initialization voltage VINT. Here, the first initialization voltage VINT may have a low-level voltage value, and according to an embodiment, the first initialization voltage VINT may be a low voltage capable of turning on the driving transistor T1.

Meanwhile, at this time, the turned-on tenth transistor T10 does not perform any particular operation.

Then, while the third scan signal GI is changed to a gate-off voltage (a high-level voltage), the second scan signal GC is changed to a gate-on voltage (a low-level voltage). At this time, the gate-on voltage (the high-level voltage) of the second/first scan signal GC2 is maintained.

As a result, the fourth transistor T4 is turned off, and according to the second scan signal GC, the third transistor T3 and the fifth transistor T5 are turned on. At this time, the tenth transistor T10 and the eleventh transistor T11 remain turned on, and the ninth transistor T9 also remains turned on.

By the turned-on fifth transistor T5 and tenth transistor T10, the reference voltage VREF is transmitted to the data node (D node), and then the data node (D node), the second storage electrode, and the second electrode of the hold capacitor Chold are initialized into the reference voltage VREF. Due to the reference voltage VREF, the voltage of one terminal (the second electrode of the storage capacitor Cst and the second electrode of the hold capacitor Chold) of each capacitor is kept constant.

Also, an operation for compensating the threshold voltage of the driving transistor T1 is performed by the turned-on third transistor T3 and eleventh transistor T11. By the turned-on third transistor T3 and eleventh transistor T11, the first initialization voltage VINT applied to the gate node (G_node) is also transmitted to the second electrode of the driving transistor T1. At this time, the driving transistor T1 has a diode connection structure in which the driving gate electrode and the second electrode are connected. The driving transistor T1 has a turn-on state by the first initialization voltage VINT, and the driving voltage ELVDD transmitted to the first electrode of the driving transistor T1 is transmitted to the driving gate electrode of the driving transistor T1 and the first electrode of the storage capacitor Cst through the second electrode of the driving transistor T1, the third transistor T3, and the eleventh transistor T11. Accordingly, the voltage of the driving gate electrode of the driving transistor T1 gradually rises from the first initialization voltage VINT, and then the driving transistor T1 is turned off when it is lower than the driving voltage ELVDD by the threshold voltage of the driving transistor T1. The voltage of the driving gate electrode when the driving transistor T1 is turned off is stored in the first storage electrode of the storage capacitor Cst, and the voltage of the first storage electrode of the storage capacitor Cst may be as shown in Equation 1 below.

$$V_{cst1} = V_{ELVDD} - V_{th} \quad \text{[Equation 1]}$$

Here, Vcst1 represents a voltage of the first storage electrode of the storage capacitor Cst, $V_{ELVDD}$ represents a voltage value of the driving voltage ELVDD, and Vth represents a threshold voltage value of the driving transistor T1.

According to Equation 1, the threshold voltage Vth values that may have different values for each driving transistor T1 may be compensated.

According to the above compensation section, the second storage electrode of the storage capacitor Cst has the reference voltage VREF, and the first storage electrode has the voltage value of Equation 1.

The initialization and compensation section may be divided into a first section in which the third scan signal GI is applied with the gate-on voltage (a low-level voltage) and the second scan signal GC is applied with the gate-off voltage (a high-level voltage) and a second section in which the third scan signal GI is applied with the gate-off voltage (a high-level voltage) and the second scan signal GC is applied with the gate-on voltage (a low-level voltage). Referring to FIG. 2, the initialization and compensation section includes the first section and the second section alternately, multiple times. In the embodiment of FIG. 2, the first section and the second section are both performed three times. However, according to an embodiment, the initialization and compensation section may include one first section and one second section.

In the embodiment of FIG. 2, as the second scan signal GC and the third scan signal GI are changed to the gate-off voltage (a high-level voltage), the initialization and compensation section ends and the writing section begins.

In the writing section, the gate-off voltage (a high-level voltage) is applied as the second scan signal GC, the third scan signal GI, and the second light emission signal EM2, and the gate-on voltage is applied as the second/first scan signal GC2 and the first light emission signal EM1, during 1H, while the first scan signal GW is changed to the gate-on voltage (a low-level voltage), and the data voltage VDATA enters the pixel.

In the writing section, the second transistor T2 to which the first scan signal GW is applied is turned on, so that the data voltage VDATA is output to the second electrode of the second transistor T2 and is transmitted to the second storage electrode of the storage capacitor Cst and the second electrode of the hold capacitor Chold through the tenth transistor T10.

In the writing section, the second electrode of the storage capacitor Cst is changed from the reference voltage VREF, which is the voltage applied to the compensation section, to the data voltage VDATA value. At this time, the voltage value of the first electrode of the storage capacitor Cst is changed in proportion to the voltage change amount of the second electrode of the storage capacitor Cst. That is, since the voltage change amount of the second electrode of the storage capacitor Cst is the voltage difference between the data voltage VDATA and the reference voltage VREF, the voltage of the first electrode of the storage capacitor Cst is additionally changed by a value proportional to the voltage difference between the data voltage VDATA and the reference voltage VREF from the voltage value of Equation 1. At this time, the voltage value of the first electrode of the storage capacitor Cst may be lowered. As the voltage value of the gate electrode of the driving transistor T1 is lowered, the degree to which the driving transistor T1 is turned on is determined and the magnitude of the output current is determined.

In FIG. 2, the gate-on voltage (a low-level voltage) of the first scan signal GW may be maintained for 1H, 1H representing one horizontal period, and one horizontal period may correspond to one horizontal synchronizing signal Hsync. 1H may mean a time when the gate-on voltage is applied to the scan line of a next row after the gate-on voltage is applied to one scan line. Referring to FIG. 2, it may be confirmed that the initialization and compensation section, the bias section, and the light emission section are longer than the writing section of 1H, and according to an embodiment, the compensation section may have a time of 3H or more so that the threshold voltage of the driving transistor T1 may be sufficiently compensated. That is, the pixel is divided into the initialization and compensation section for compensating the threshold voltage of the driving transistor T1 and the writing section for writing the data voltage VDATA, in the case of high-speed driving by extending the compensation time three times longer than the writing section 1H, even if the time of 1H is very short, the period of 3H or more is secured so that the compensation time will not be insufficient and sufficient compensation may be obtained during high-speed operation.

After that, the second/first scan signal GC2 and the first light emission signal EM1 are changed to the gate-off voltage, the writing section ends and the bias section begins.

The bias section is a section in which the fourth scan signal EB is applied with the gate-on voltage (a low-level voltage), by the seventh transistor T7 to which the fourth scan signal EB is applied, and the anode of the light emitting diode LED is initialized into the second initialization voltage VAINT.

In addition, the bias voltage Vbias is applied to the first electrode of the driving transistor T1 by the eighth transistor T8 receiving the fourth scan signal EB. The characteristic of the driving transistor T1 to which the bias voltage Vbias is applied may be kept constant, and particularly, even if a separate data voltage VDATA is not input to the pixel, the driving transistor T1 may generate the output current constantly with the previously transmitted data voltage VDATA. This operation serves to maintain the characteristics of the driving transistor T1 during high-speed driving or low-speed driving, and may also reduce power consumption.

Referring to FIG. 2, the period during which the fourth scan signal EB maintains the gate-on voltage (a low-level voltage) may be 1H, and the fourth scan signal EB may apply the gate-on voltage (a low-level voltage) multiple times. FIG. 2 shows an embodiment in which the fourth scan signal EB applies the gate-on voltage (a low-level voltage) three times.

After that, the first light emission signal EM1 and the second light emission signal EM2 are changed to the gate-on voltage (a low-level voltage) and the light emission section begins. At this time, the driving transistor T1 receives the driving voltage ELVDD to generate the output current depending on the voltage (the voltage of the first storage electrode) of the driving gate electrode to be output to the anode of the light emitting diode LED. As a result, the light emitting diode LED receives the output current of the driving transistor T1 and emits light.

Thus far, the circuit structure and operation of the pixel have been described.

The structure of the embodiment described below may have the circuit structure shown in FIG. 1, and receive the signal of the same waveform as what is shown in FIG. 2. However, the embodiment described below is not limited to the the circuit structure of FIG. 1 or to receiving the signal of the waveform shown in FIG. 2.

The layered structure of the pixel circuit unit and the anode among the pixel according to an embodiment is schematically described with reference to FIG. 3 and FIG. 4.

Figure 3:
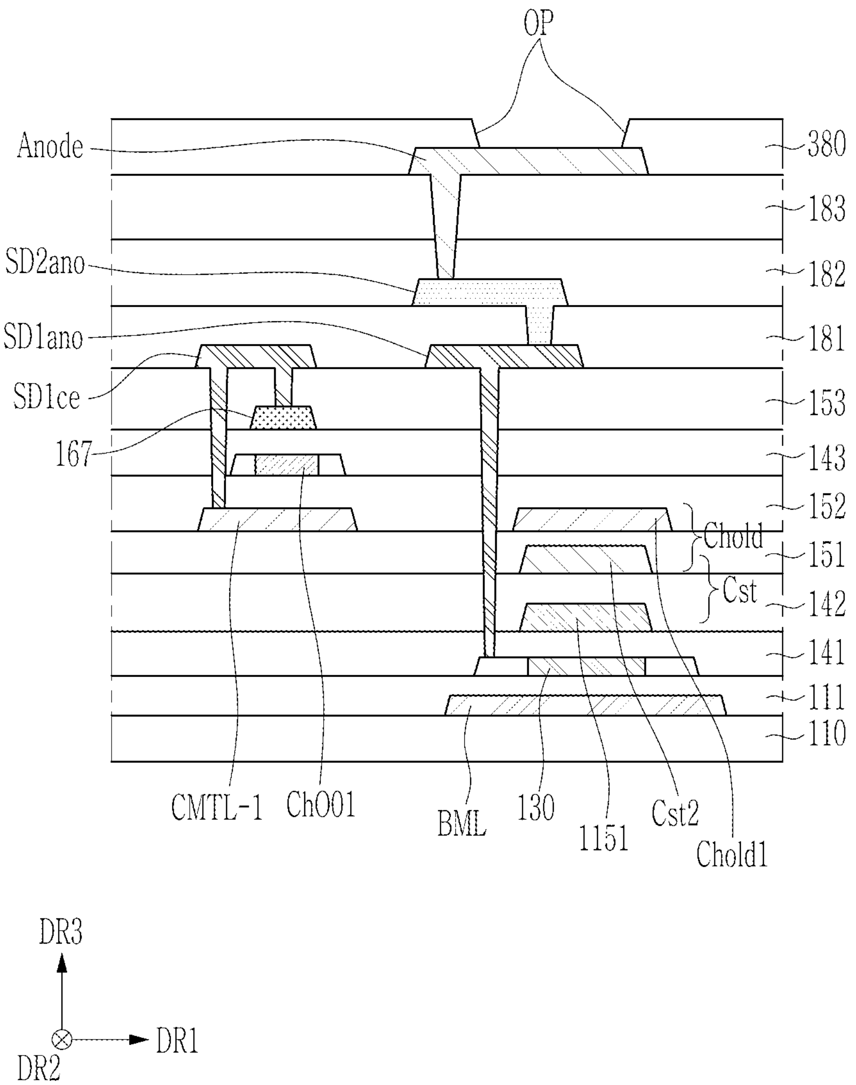
FIG. 3 is a cross-sectional view of a light emitting display device according to an embodiment.

FIG. 3 is a cross-sectional view of a light emitting display device according to an embodiment. FIG. 4 is a view schematically showing a layered structure of a light emitting display device according to an embodiment.

Figure 4:
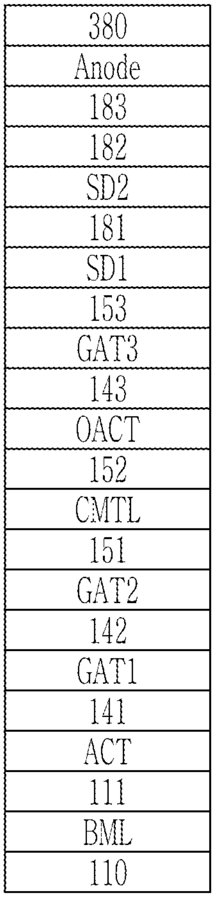
FIG. 4 is a view schematically showing a layered structure of a light emitting display device according to an embodiment.

FIG. 3 schematically shows the detailed cross-section structure, and FIG. 4 is a schematic diagram showing each layer of FIG. 3 based on a process sequence.

Referring to FIG. 3 and FIG. 4, an overlapping electrode BML is positioned on a substrate 110.

The substrate 110 may include a rigid material such as glass, or a flexible material such as plastic or polyimide. In the case of the flexible substrate, it may have a double-layered structure of polyimide, and a barrier layer formed of an inorganic insulating material thereon.

The overlapping electrode BML may be formed at a position overlapping the channel of the driving transistor T1 in a plan view among a subsequent first semiconductor layer ACT and is also referred to as a lower shielding layer.

The overlapping electrode BML may overlap one of the other transistors including the first semiconductor layer ACT in a plane in addition to the driving transistor T1. The overlapping electrode BML may include a metal such as copper (Cu), molybdenum (Mo), aluminum (Al), titanium (Ti), or a metal alloy.

On the substrate 110 and the overlapping electrode BML, a buffer layer 111 covering them is positioned.

The buffer layer 111 may serve to block the penetration of impure elements from the lower part during the crystallization process of the first semiconductor layer ACT, and may be an inorganic insulating layer including silicon oxide (SiOx) or silicon nitride (SiNx), silicon oxynitride (SiONx), etc. It includes a plurality of inorganic insulating layers.

The first semiconductor layer ACT formed of a silicon semiconductor (e.g., a polycrystalline semiconductor) is positioned above the buffer layer 111. The first semiconductor layer ACT includes a channel 130 of a polycrystalline transistor including a driving transistor T1, and a first region and a second region positioned on both sides of the channel 130. According to the embodiment of FIG. 1, the polycrystalline transistor may include a second transistor T2, a third transistor T3, a fourth transistor T4, a fifth transistor T5, a sixth transistor T6, a seventh transistor T7, an eighth transistor T8, and a ninth transistor T9 in addition to the driving transistor T1. In addition, both sides of the channel 130 of the polycrystalline transistor have a region having a conductive characteristic by a plasma treatment or a doping process, which may serve as a first electrode and a second electrode of the transistor.

A first gate insulating layer 141 may be positioned on the first semiconductor layer ACT. The first gate insulating layer 141 may be an inorganic insulating layer including silicon oxide (SiOx), silicon nitride (SiNx), silicon oxynitride (SiONx), or the like, and may include a plurality of inorganic insulating layers.

A first gate conductive layer GAT1 including a gate electrode of the polycrystalline transistor may be positioned on the first gate insulating layer 141. The first gate conductive layer GAT1 includes a driving gate electrode 1151 of the driving transistor T1. The first gate conductive layer may include a metal or metal alloy such as copper (Cu), molybdenum (Mo), aluminum (Al), or titanium (Ti), and may be composed of a single layer or multiple layers.

After forming the first gate conductive layer GAT1, a plasma treatment or a doping process may be performed to conduct the exposed region of the first semiconductor layer ACT. That is, the first semiconductor layer ACT covered by the first gate conductive layer GAT1 is not conductive, and a portion of the first semiconductor layer ACT not covered by the first gate conductive layer GAT1 may have the same characteristics as the conductive layer.

A second gate insulating layer 142 may be positioned on the first gate conductive layer GAT1 and the first gate insulating layer 141. The second gate insulating layer 142 may be an inorganic insulating layer including silicon oxide (SiOx), silicon nitride (SiNx), silicon oxynitride (SiONx), or the like, and may include a plurality of inorganic insulating layers.

A second gate conductive layer GAT2 including a second storage electrode Cst2 of a storage capacitor Cst may be positioned on the second gate insulating layer 142. The second gate conductive layer GAT2 may include a metal or metal alloy such as copper (Cu), molybdenum (Mo), aluminum (Al), or titanium (Ti), and may be composed of a single layer or multiple layers. Here, the storage capacitor Cst may be formed by using the driving gate electrode 1151 of the driving transistor T1 and the second storage electrode Cst2 as two electrodes, and the second gate insulating layer 142 positioned between them as a dielectric layer.

A first interlayer insulating layer 151 may be positioned on the second gate conductive layer GAT2. The first interlayer insulating layer 151 may include an inorganic insulating layer including silicon oxide (SiOx), silicon nitride (SiNx), silicon oxynitride (SiONx), and the like, and may include a plurality of inorganic insulating layers. In addition, according to an embodiment, the inorganic insulating material may be formed thickly.

On the first interlayer insulating layer 151, an auxiliary conductive layer CMTL including a first hold electrode Chold1 of the hold capacitor Chold is positioned thereon. The auxiliary conductive layer CMTL also includes an auxiliary electrode line CMTL-1 positioned under and overlapping the oxide transistor, the characteristic of the oxide transistor is changed depending on the voltage applied to the auxiliary electrode line CMTL-1, and the auxiliary electrode line CMTL-1 may be formed as an auxiliary electrode having an island-like structure, according to an embodiment. The auxiliary conductive layer CMTL may include a metal or metal alloy such as copper (Cu), molybdenum (Mo), aluminum (Al), or titanium (Ti), and may be composed of a single layer or multiple layers. Here, the hold capacitor Chold may be formed by using the second storage electrode Cst2 and the first hold electrode Chold1 as two electrodes, and using a first interlayer insulating layer 151 positioned between them as a dielectric layer.

A second interlayer insulating layer 152 may be positioned on the auxiliary conductive layer CMTL. The second interlayer insulating layer 152 may include an inorganic insulating layer including silicon oxide (SiOx), silicon nitride (SiNx), silicon oxynitride (SiONx), and the like, and may include a plurality of inorganic insulating layers. In addition, according to an embodiment, the inorganic insulating material may be formed thickly.

An oxide semiconductor layer OACT including a channel ChO10, a first region, and a second region of an oxide transistor may be positioned on the second interlayer insulating layer 152. Here, the channel ChO10 of the oxide transistor may be the channel of the tenth transistor T10 or the eleventh transistor T11 in the embodiment of FIG. 1.

A third gate insulating layer 143 may be positioned on the oxide semiconductor layer OACT. The third gate insulating layer 143 may be positioned on the entire surface of the oxide semiconductor layer OACT and the second interlayer insulating layer 152. The third gate insulating layer 143 may include an inorganic insulating layer including silicon oxide (SiOx), silicon nitride (SiNx), silicon oxynitride (SiONx), and the like, and may include a plurality of inorganic insulating layers.

A third gate conductive layer GAT3 including a second/first scan line 167 including a gate electrode of the oxide transistor may be positioned on the third gate insulating layer 143. The gate electrode of the oxide transistor may overlap the channel. The third gate conductive layer GAT3 may include a metal or metal alloy such as copper (Cu), molybdenum (Mo), aluminum (Al), or titanium (Ti), and may be composed of a single layer or multiple layers.

After forming the third gate conductive layer GAT3, the exposed region of the oxide transistor may be made conductive by performing a plasma treatment or doping process. That is, the channel ChO10 of the oxide transistor covered by the third gate conductive layer GAT3 is not conductive, and a portion of the oxide transistor not covered by the third gate conductive layer GAT3 may have the same characteristic as that of the conductive layer.

A third interlayer insulating layer 153 may be positioned on the third gate conductive layer GAT3. The third interlayer insulating layer 153 may have a single-layer or multi-layered structure. The third interlayer insulating layer 153 may include an inorganic insulating material such as silicon nitride (SiNx), silicon oxide (SiOx), and silicon oxynitride (SiOxNy), and may include an organic material according to an embodiment. The third interlayer insulating layer 153 may also be formed as a single layer or a plurality of layers according to an embodiment.

On the third interlayer insulating layer 153, a first data conductive layer SD1 including a plurality of connecting electrodes SD1*ce* and SD1*ano* that may be connected to the first region and the second region of each of the polycrystalline transistor and the oxide transistor may be positioned thereon. Among the plurality of connecting electrodes positioned in the first data conductive layer SD1, the anode connecting electrode SD1*ano* electrically connects one of the polycrystalline transistors to the anode Anode, and the connecting electrode SD1*ce* connects the second/first scan line 167 including the gate electrode of the oxide transistor and the auxiliary electrode line CMTL-1 positioned below the oxide transistor. According to an embodiment, the first data conductive layer SD1 may further include various connecting electrodes, and at least one of the connecting electrodes shown in FIG. 3 may be omitted. The first data conductive layer SD1 may include a metal or metal alloy such as aluminum (Al), copper (Cu), molybdenum (Mo), and titanium (Ti), and may be composed of a single layer or multiple layers.

A first organic layer 181 may be positioned on the first data conductive layer SD1. The first organic layer 181 may be an organic insulator including an organic material, and the organic material may include one or more materials selected from a group consisting of polyimide, polyamide, acryl resin, benzocyclobutene, and phenol resin.

On the first organic layer 181, a second data conductive layer SD2 including an anode connecting electrode SD2*ano* may be positioned. The second data conductive layer SD2 may further include a data line or a driving voltage line. The anode connecting electrode SD2*ano* electrically connects one of the polycrystalline transistors and the anode together with the anode connecting electrode SD1*ano* positioned on the first data conductive layer SD1. The second data conductive layer SD2 may include a metal or metal alloy such as aluminum (Al), copper (Cu), molybdenum (Mo), or titanium (Ti), and may be composed of a single layer or multiple layers.

A second organic layer 182 and a third organic layer 183 are positioned on the second data conductive layer SD2, and an opening is formed on the second organic layer 182 and the third organic layer 183 so that the anode connecting electrode SD2*ano* and the anode are electrically connected. The second organic layer 182 and the third organic layer 183 may include one or more materials selected from a group consisting of polyimide, polyamide, acryl resin, benzocyclobutene, and phenol resin. According to an embodiment, the third organic layer 183 may be omitted.

On the third organic layer 183, the anode constituting the light emitting diode is positioned thereon. The anode may be composed of a single layer including a transparent conductive oxide film or a metal material or multiple layers including a transparent conductive oxide film and/or a metal material. The transparent conductive oxide layer may include indium tin oxide (ITO), poly-ITO, indium zinc oxide (IZO), indium gallium zinc oxide (IGZO), and indium tin zinc oxide (ITZO). The metal material may include silver (Ag), molybdenum (Mo), copper (Cu), gold (Au) and aluminum (Al).

On the anode, a pixel definition layer 380 covering at least part of the anode while having an opening OP exposing the anode may be positioned thereon. The pixel definition layer 380 may be a black pixel definition layer formed of an organic material with a black color so that light applied from the outside is not reflected back to the outside, and according to an embodiment, it may be formed of a transparent organic material. A spacer (not shown) may be positioned above the pixel definition layer 380, and the spacer may be formed of the same material as the pixel definition layer 380.

FIG. 3 and FIG. 4 show the upper structure of the pixel definition layer 380, but according to an embodiment, a structure like that below may be provided.

On the anode and the pixel definition layer 380, a functional layer and a cathode are sequentially formed, and the functional layer and the cathode may be positioned in the entire region in the display area. A light emitting layer may be positioned between the functional layers, and the light emitting layer may be positioned only within the opening OP of the pixel definition layer 380. Hereinafter, the combination of the functional layer and the light emitting layer may be referred to as an intermediate layer. The functional layer may include at least one of an auxiliary layer such as an electron injection layer, an electron transport layer, a hole transport layer, and a hole injection layer, the hole injection layer and the hole transport layer may be positioned under the emission layer, and the electron transport layer and the electron injection layer may be positioned on the emission layer.

An encapsulation layer is positioned on the cathode. The encapsulation layer may include at least one inorganic film and at least one organic layer, and may have a triple-layer structure including, according to an embodiment, a first inorganic encapsulation layer, an organic encapsulation layer, and a second inorganic encapsulation layer. The encapsulation layer may be for protecting the light emitting layer from moisture or oxygen that may inflow from the outside. Depending on the embodiment, the encapsulation layer may include a structure in which an inorganic layer and an organic layer are sequentially further stacked.

According to the embodiment, a sensing insulating layer and a plurality of sensing electrodes for touch sensing may be positioned on the encapsulation layer.

In addition, a light blocking layer and a color filter layer may be positioned on the encapsulation layer. According to an embodiment, a color conversion layer may be formed instead of the color filter layer. The color conversion layer may include quantum dots.

In the above, the layered structure of the overall light emitting display device and pixel was examined.

Hereinafter, the planar structure of the conductive layer except for some conductive layers and the semiconductor layer is examined in detail with reference to FIG. 5.

Figure 5:
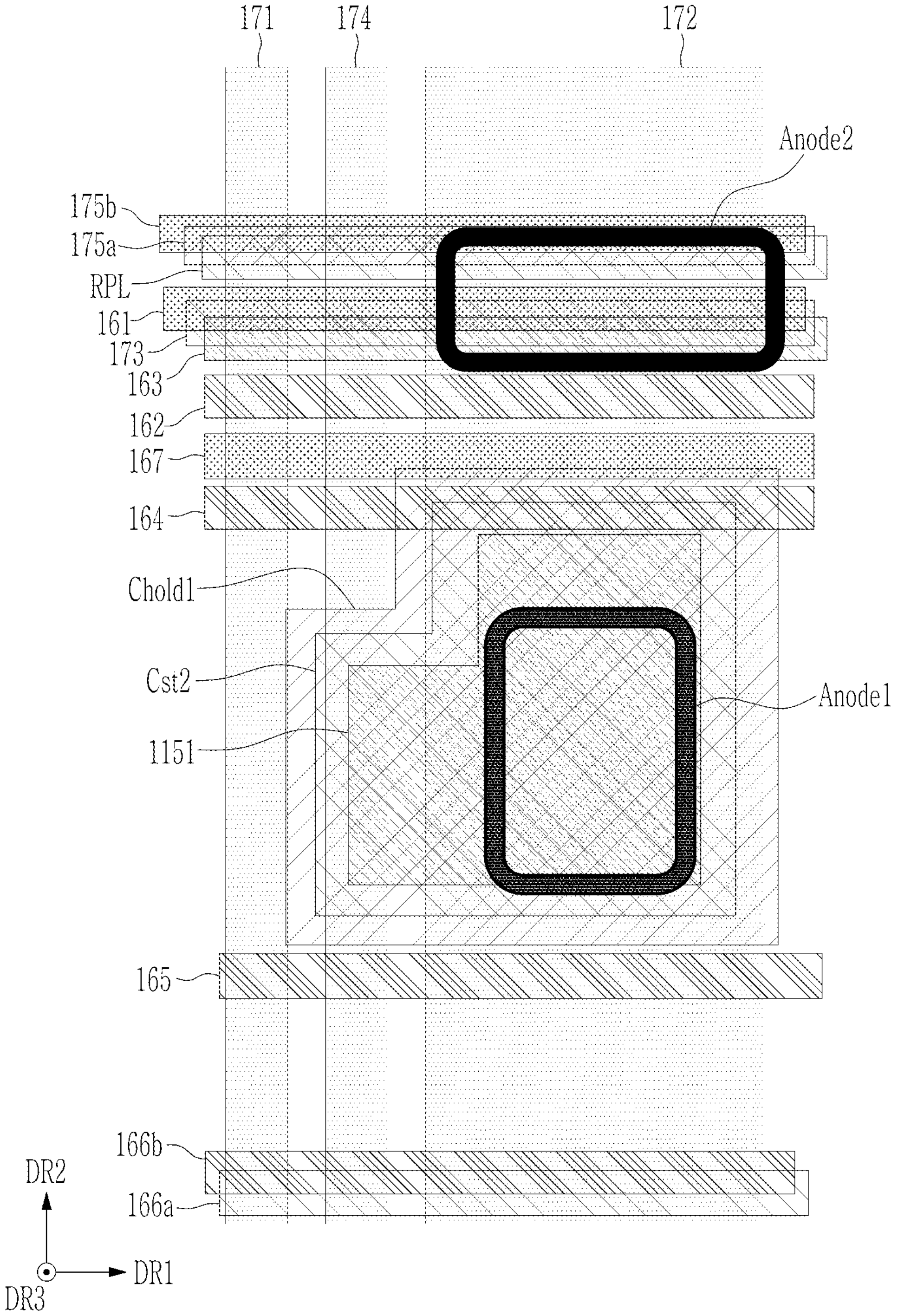
FIG. 5 is a view showing a planar structure of some conductive layers and an anode of a lower panel layer among a light emitting display device according to an embodiment.

FIG. 5 is a view showing a planar structure of some conductive layers and an anode among a lower panel layer of a light emitting display device according to an embodiment.

FIG. 5 does not show the substrate 110, the buffer layer 111, and each insulating layer (a first gate insulating layer 141, a second gate insulating layer 142, a first interlayer insulating layer 151, a second interlayer insulating layer 152, a third gate insulating layer 143, a third interlayer insulating layer 153, a first organic layer 181, a second organic layer 182, a third organic layer 183) among each layer included in FIG. 4, additionally, the overlapping electrode BML, the first semiconductor layer ACT, an oxide semiconductor layer OACT, and a pixel definition layer 380 are also not shown. Therefore, FIG. 5 shows a first gate conductive layer GAT1, a second gate conductive layer GAT2, an auxiliary conductive layer CMTL, a third gate conductive layer GAT3, a first data conductive layer SD1, a second data conductive layer SD2, and anodes Anode1 and Anode2. In FIG. 5, to show only the conductive layer as above is to omit the overlapping electrode BML, the first semiconductor layer ACT, and the oxide semiconductor layer OACT because their effect is small in disposing each conductive layer so that the anodes Anode1 and Anode2 have a flat characteristic.

Specifically, each part shown in the embodiment of FIG. 5 is included in which the conductive layer is summarized as follows.

The first gate conductive layer GAT1 includes a driving gate electrode 1151 and a third scan line 163, the second gate conductive layer GAT2 includes a repair line RPL, a first initialization voltage line 173, a second storage electrode Cst2, and a lower fourth scan line 166*a*, the auxiliary conductive layer CMTL includes a lower second initialization voltage line 175*a* and a first hold electrode Chold1, the third gate conductive layer GAT3 includes an upper second initialization voltage line 175*b*, a first scan line 161, and a second/first scan line 167, the first data conductive layer SD1 includes a second scan line 162, a first light emission signal line 164, a second light emission signal line 165, and an upper fourth scan line 166*b*, and the second data conductive layer SD2 includes a data line 171, a driving voltage line 172, and a reference voltage line 174.

Among them, the data line 171, the driving voltage line 172, and the reference voltage line 174 included in the second data conductive layer SD2 extend in the second direction DR2.

On the other hand, the third scan line 163 included in the first gate conductive layer GAT1, the repair line RPL, the first initialization voltage line 173, and the lower fourth scan line 166*a* included in the second gate conductive layer GAT2, the lower second initialization voltage line 175*a* included in the auxiliary conductive layer CMTL, the upper second initialization voltage line 175*b*, the first scan line 161, and the second/first scan line 167 included in the third gate conductive layer GAT3, and the second scan line 162, the first light emission signal line 164, the second light emission signal line 165, and the upper fourth scan line 166*b* included in the first data conductive layer SD1 extend in the first direction DR1.

In addition, the driving gate electrode 1151 included in the first gate conductive layer GAT1, the second storage electrode Cst2 included in the second gate conductive layer GAT2, and the first hold electrode Chold1 included in the auxiliary conductive layer CMTL overlap each other and each has an island structure. The driving gate electrode 1151, the second storage electrode Cst2, and the first hold electrode Chold1 overlap each other on a plane to form a storage capacitor Cst and a hold capacitor Chold. Specifically, the driving gate electrode 1151 and the second storage electrode Cst2 may be two electrodes of the storage capacitor Cst, and the second storage electrode Cst2 and the first hold electrode Chold1 may be two electrodes of the hold capacitor Chold. Therefore, the driving gate electrode 1151 may serve as one electrode of the storage capacitor Cst together with the role of the gate electrode of the driving transistor T1, and the second storage electrode Cst2 may also play the role of one electrode of the hold capacitor Chold along with the role of the other electrode of the storage capacitor Cst.

In FIG. 5, the repair line RPL is included in the second gate conductive layer GAT2, but according to an embodiment, the repair line RPL may not be included in the embodiment in which the repair line RPL is not included; another wiring, for example, the driving low voltage line 179 or the bias voltage line 176 may be positioned therein.

FIG. 5 shows two anodes Anode1 and Anode2.

In FIG. 5, the first anode Anode1 overlaps the driving gate electrode 1151 included in the first gate conductive layer GAT1, the second storage electrode Cst2 included in the second gate conductive layer GAT2, and the first hold electrode Chold1 included in the auxiliary conductive layer CMTL on a plane. That is, the first anode Anode1 overlaps three conductive layers of the first gate conductive layer GAT1, the second gate conductive layer GAT2, and the auxiliary conductive layer CMTL except for the overlapping electrode BML, the first semiconductor layer ACT, and the oxide semiconductor layer OACT. Hereinafter, three conductive layers of the first gate conductive layer GAT1, the second gate conductive layer GAT2, and the auxiliary conductive layer CMTL may also be referred to as a capacitor triple layer. In addition, the first anode Anode1 and the second anode Anode2 overlap the driving voltage line 172 positioned on the second data conductive layer SD2. Referring to FIG. 5, the entire first anode Anode1 is positioned on the capacitor triple layer and the driving voltage line 172, giving it an overall flat characteristic.

As shown in FIG. 5, the second anode Anode2 overlaps the triple overlapping wiring of the first group and the second group that extend in the first direction DR1. The second anode Anode2 also overlaps the driving voltage line 172 positioned on the second data conductive layer SD2 (shown in FIG. 4). As described above, the driving voltage line 172 also overlaps the first anode Anode1.

Specifically, the triple overlapping wiring included in the first group includes the third scan line 163 included in the first gate conductive layer GAT1, the first initialization voltage line 173 included in the second gate conductive layer GAT2, and the first scan line 161 included in the third gate conductive layer GAT3, and the triple overlapping wiring included in the first group overlaps a part of the second anode Anode2. In addition, the triple overlapping wiring included in the second group includes the repair line RPL included in the second gate conductive layer GAT2, the lower second initialization voltage line 175*a* included in the auxiliary conductive layer CMTL, and the second initialization voltage line 175*b* included in the upper third gate conductive layer GAT3, and the triple overlapping wiring included in the second group overlaps a part of the remaining parts of the second anode Anode2. Therefore, referring to FIG. 5, due to the triple overlapping wiring of two groups, the second anode Anode2 may also have an overall flat characteristic. Hereinafter, three triple overlapping wirings included in the first group or the second group are also referred to as a first overlapping wiring, a second overlapping wiring, and a third overlapping wiring. Three triple overlapping wirings included in the other groups may also be referred to as a fourth overlapping wiring, a fifth overlapping wiring, and a sixth overlapping wiring.

Although each of the first anode Anode1 and the second anode Anode2 overlaps with different three conductive layers, since the thicknesses of the conductive layers under the first anode Anode1 and the second anode Anode2 do not differ significantly, and three organic layers 181, 182, and 183, and the second data conductive layer SD2 are commonly positioned under both of the anodes Anode1 and Anode2, the organic layers 182/183 may be at the same height, achieving flatness.

The thickness and flatness characteristics of the first anode Anode1 and the second anode Anode2 are described in more detail with reference to FIG. 6.

Figure 6:
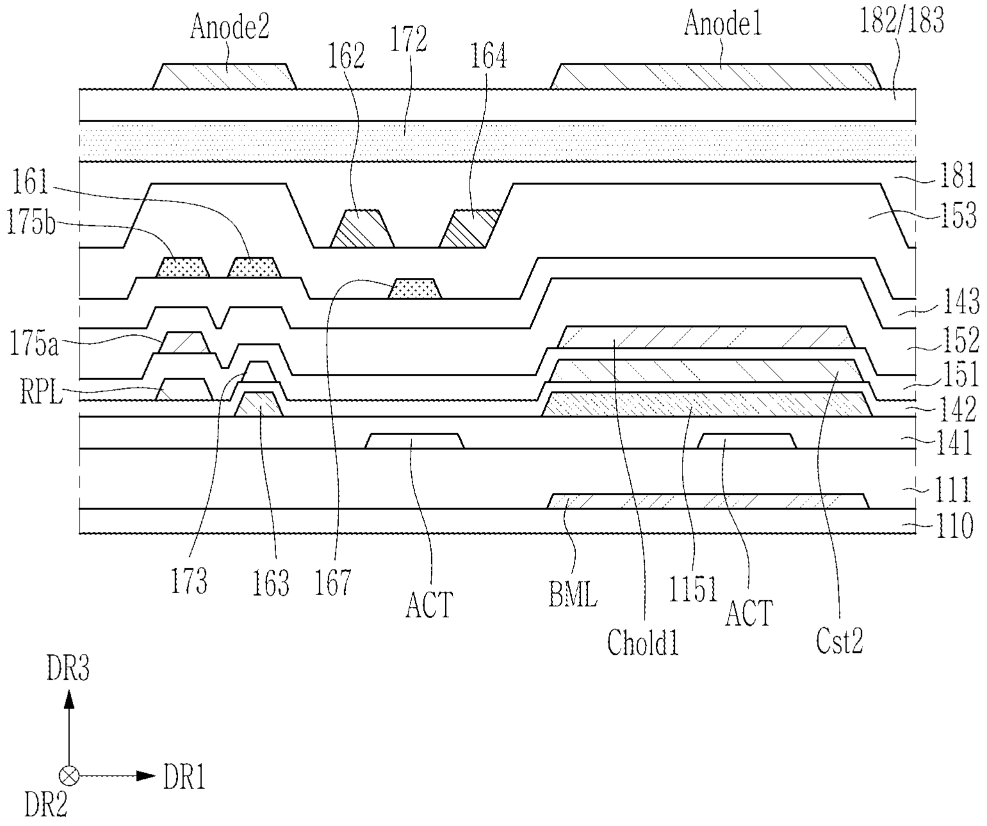
FIG. 6 is a cross-sectional view of a light emitting display device according to an embodiment of FIG. 5.

FIG. 6 is a cross-sectional view of a light emitting display device according to an embodiment of FIG. 5.

FIG. 6 corresponds to the cross-section structure of FIG. 3, but unlike FIG. 3, the lower layered structure of the first anode Anode1 and the second anode Anode2 is shown in detail.

Referring to FIG. 6, the lower layered structure of the first anode Anode1 is sequentially stacked as shown below from the substrate 110.

An overlapping electrode BML is positioned on a substrate 110, a buffer layer 111 is positioned on the overlapping electrode BML, a first semiconductor layer ACT is positioned on the buffer layer 111, a first gate insulating layer 141 is positioned on the first semiconductor layer ACT, a driving gate electrode 1151 included in the first gate conductive layer GAT1 is positioned on the first gate insulating layer 141, a second gate insulating layer 142 is positioned on the first gate conductive layer GAT1, a second storage electrode Cst2 included in a second gate conductive layer GAT2 is positioned on the second gate insulating layer 142, a first interlayer insulating layer 151 is positioned on the second gate conductive layer GAT2, a first hold electrode Chold1 included in an auxiliary conductive layer CMTL is positioned on the first interlayer insulating layer 151, a second interlayer insulating layer 152 is positioned on the auxiliary conductive layer CMTL, a third gate insulating layer 143, a third interlayer insulating layer 153, and a first organic layer 181 are sequentially positioned on the second interlayer insulating layer 152, a driving voltage line 172 disposed in a second data conductive layer SD2 is positioned on the first organic layer 181, a second organic layer 182 and a third organic layer 183 are sequentially positioned on the second data conductive layer SD2, and a first anode Anode1 is positioned on the third organic layer 183.

Meanwhile, the lower structure of the second anode Anode2 is as follows.

The buffer layer 111 is positioned on the substrate 110, the first gate insulating layer 141 is positioned on the buffer layer 111, a third scan line 163 included in the first gate conductive layer GAT1 is positioned on the first gate insulating layer 141, the second gate insulating layer 142 is positioned on the first gate conductive layer GAT1, a first initialization voltage line 173 and a repair line RPL included in the second gate conductive layer GAT2 are positioned on the second gate insulating layer 142, the first interlayer insulating layer 151 is positioned on the second gate conductive layer GAT2, a lower second initialization voltage line 175*a* included in the auxiliary conductive layer CMTL is positioned on the first interlayer insulating layer 151, the second interlayer insulating layer 152 is positioned on the auxiliary conductive layer CMTL, the third gate insulating layer 143 is positioned on the second interlayer insulating layer 152, a first scan line 161 and an upper second initialization voltage line 175*b* included in the third gate conductive layer GAT3 are positioned on the third gate insulating layer 143, the third interlayer insulating layer 153 is positioned on the third gate conductive layer GAT3, the first organic layer 181 is positioned on the third interlayer insulating layer 153, the driving voltage line 172 included in the second data conductive layer SD2 is positioned on the first organic layer 181, the second organic layer 182 and the third organic layer 183 are sequentially positioned on the second data conductive layer SD2, and a second anode Anode2 is positioned on the third organic layer 183.

Since only the capacitor triple layer is positioned below the first anode Anode1, the layered structure is simple, and the first anode Anode1 may be flat as a whole. On the other hand, the layered structure is somewhat more complicated as two groups of the triple overlapping wiring are positioned under the second anode Anode2. Specifically, among two groups of the triple overlapping wiring positioned below the second anode Anode2, the triple overlapping wiring included in the first group may consist of the third scan line 163 included in the first gate conductive layer GAT1, the first initialization voltage line 173 included in the second gate conductive layer GAT2, and the first scan line 161 included in the third gate conductive layer GAT3, and the triple overlapping wiring included in the second group may consist of the repair line RPL included in the second gate conductive layer GAT2, the lower second initialization voltage line 175*a* included in the auxiliary conductive layer CMTL, and the upper second initialization voltage line 175*b* included in the third gate conductive layer GAT3. In addition, a part of the second anode Anode2 may be formed at the same height as the first anode Anode1 by the triple overlapping wiring included in the first group, and a part of the remaining part of the second anode Anode2 may be formed at the same height as the first anode Anode1 by the triple overlapping wiring included in the second group. A part of the second anode Anode2 that does not overlap with the triple overlapping wiring of two groups on a plane may be formed at the same height as the first anode Anode1 like the other portions due to the second data conductive layer (referring to the driving voltage line 172 in FIG. 6) positioned at the lower portion and the organic layers 181, 182, and 183 positioned above and below the second data conductive layer. In addition, the second anode Anode2 overlaps two groups of the triple overlapping wiring, but may have an overall flat characteristic due to the second data conductive layer (referring to the driving voltage line 172 of FIG. 6) and the organic layers 181, 182, and 183 positioned above and below the second data conductive layer.

A comparative example of FIG. 7 and FIG. 8 will now explained, and characteristics of the embodiment of FIG. 5 and FIG. 6 will described with reference to the example of FIG. 7 and FIG. 8.

Figure 7:
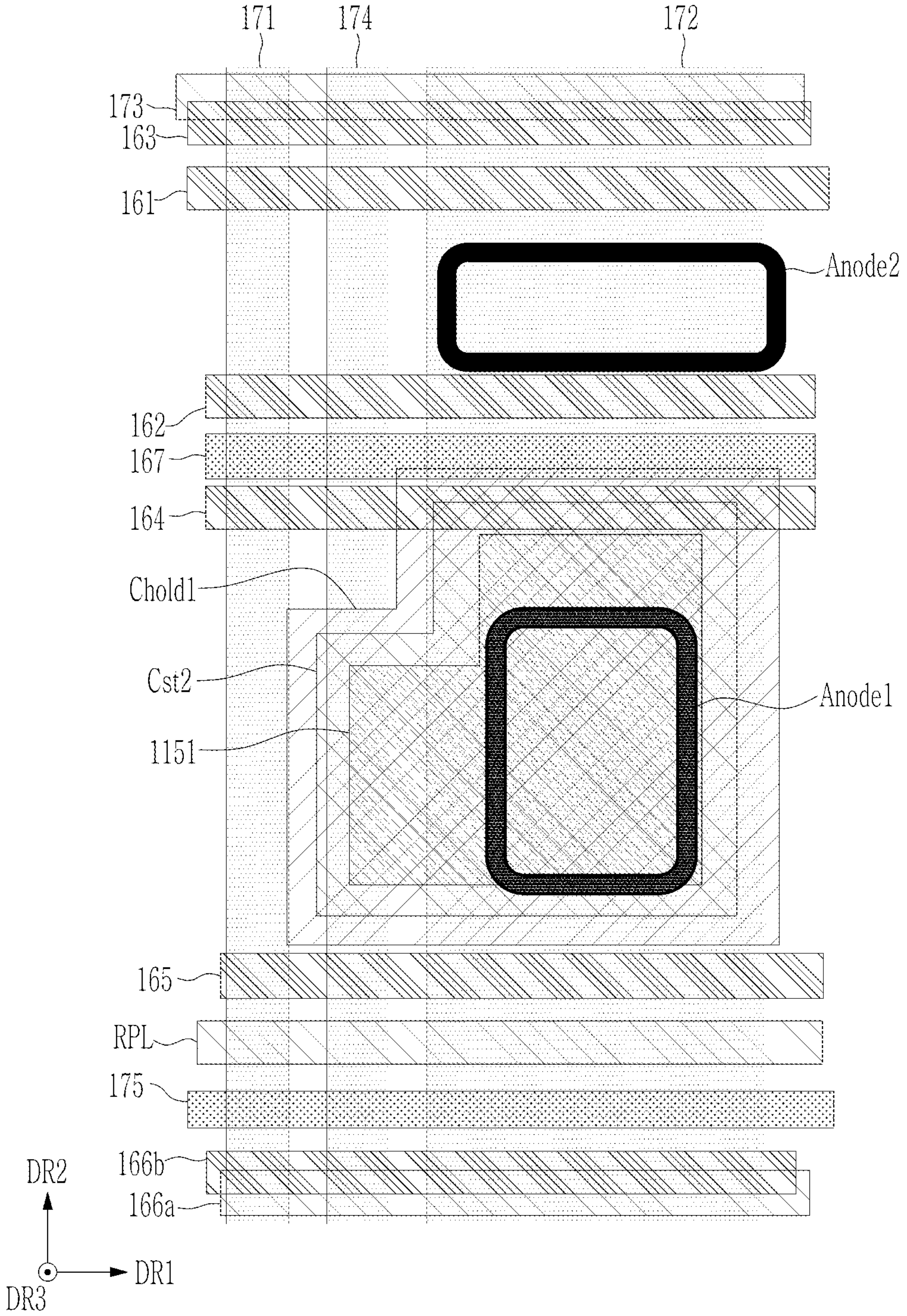
FIG. 7 is a view showing a planar structure of some conductive layers and an anode of a lower panel layer among a light emitting display device according to a comparative example.

FIG. 7 is a plan view showing a planar structure of some conductive layers and an anode among a lower panel layer of a light emitting display device according to a comparative example.

First, the flat structure of the comparative example is described through FIG. 7, and the comparative example in FIG. 7 is described focusing on the parts that differ from FIG. 5.

In the comparative example of FIG. 7, the first anode Anode1 overlaps the capacitor triple layer and the driving voltage line 172. As in FIG. 5, there is no difference in the height and flatness of the first anode Anode1. However, the comparative example of FIG. 7 is different from the embodiment of FIG. 5 in that the second anode Anode2 has a structure that does not overlap the triple overlapping wiring. Therefore, in the comparative example of FIG. 7, the second anode Anode2 may not have the same height as the first anode Anode1.

Each wiring included in two groups of the triple overlapping wiring in FIG. 5 is formed of the following conductive layer at a position that does not overlap the second anode Anode2.

The first initialization voltage line 173, the third scan line 163, and the first scan line 161 are positioned on the second direction DR2 side rather than the second anode Anode2 on a plan view. Here, the first initialization voltage line 173 may be formed of the second gate conductive layer GAT2, and the third scan line 163 and the first scan line 161 may be formed of the first data conductive layer SD1.

On the other hand, in FIG. 7, the repair line RPL and the second initialization voltage line 175 are positioned on the opposite direction side of the second direction DR2 rather than the first anode Anode1. Here, the repair line RPL may be formed of the second gate conductive layer GAT2, the second initialization voltage line 175 may be formed of a single layer of the third gate conductive layer GAT3. According to an embodiment, even in the comparative example, the second initialization voltage line 175 may be formed as a lower and upper double-layer structure. In addition, the repair line RPL and the second initialization voltage line 175 may extend in the first direction DR1 and be distanced from the first initialization voltage line 173 in the second direction DR2, as shown in FIG. 7.

Referring to FIG. 7, since the first anode Anode1 and the second anode Anode2 have constant overlapping structures, each may have a flat characteristic. However, referring to FIG. 7, only the driving voltage line 172 positioned in the second data conductive layer SD2 is positioned as the conductive layer under the second anode Anode2, but the first anode Anode1 also overlaps the capacitor triple layer in addition to the driving voltage line 172. Therefore, the first anode Anode1 may be formed at a higher position than the second anode Anode2.

Figure 8:
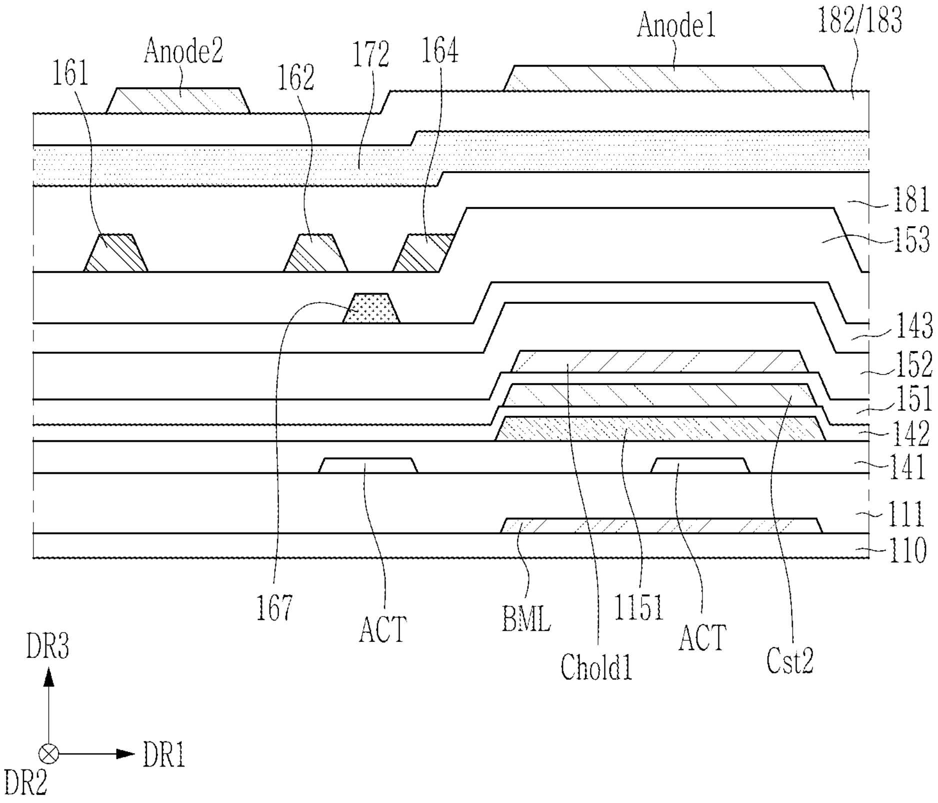
FIG. 8 is a cross-sectional view of a light emitting display device according to an embodiment of FIG. 7.

The heights of the first anode Anode1 and the second anode Anode2 are described in more detail through FIG. 8.

FIG. 8 is a cross-sectional view of a light emitting display device according to an embodiment of FIG. 7.

In FIG. 8, the height difference between the first anode Anode1 and the second anode Anode2 is clearly shown.

In the comparative example of FIG. 8, the height of the first anode Anode1 is the same as that of the embodiment of FIG. 6, but the lower layered structure of the second anode Anode2 in the comparative example of FIG. 8 is different as described below. More specifically, the height of the second anode Anode2 may be lower compared with the embodiment of FIG. 6.

In the comparative example of FIG. 8, the lower layered structure of the second anode Anode2 is as follows.

A buffer layer 111 is positioned on a substrate 110, a first gate insulating layer 141 is positioned on the buffer layer 111, a second gate insulating layer 142 is positioned on the first gate insulating layer 141, a first interlayer insulating layer 151 is positioned on the second gate insulating layer 142, a second interlayer insulating layer 152 is positioned on the first interlayer insulating layer 151, a third gate insulating layer 143 is positioned on the second interlayer insulating layer 152, a third interlayer insulating layer 153 is positioned on the third gate insulating layer 143, a first organic layer 181 is positioned on the third interlayer insulating layer 153, a driving voltage line 172 included in a second data conductive layer SD2 is positioned on the first organic layer 181, a second organic layer 182 and a third organic layer 183 are sequentially positioned on the second data conductive layer SD2, and the second anode Anode2 is positioned on the third organic layer 183.

However, the conductive layer is not positioned under the second anode Anode2 in the comparative example of FIG. 8 so that it is formed with a relatively low height.

As shown in FIG. 8, if the first anode Anode1 and the second anode Anode2 are positioned at different heights, when an external light is incident and reflected from each of two anodes Anode1 and Anode2, a reflection color band occurs due to the difference in the length of the reflection path of external light. The reflection color band may be visually recognized by a user, resulting in degradation of display quality.

However, as shown in FIG. 5 and FIG. 6, if the first anode Anode1 and the second anode Anode2 with flat characteristics are formed at the same height, even if the external light is reflected from each of two anodes Anode1 and Anode2, there is no difference in the reflection path, so the reflection color band does not occur and the display quality may have the merit of being improved.

In the above, the embodiment that overcomes the problem of the reflection color bands caused by the difference in the reflection path between two anodes Anode1 and Anode2 are described. Hereinafter, an embodiment that overcomes the problem of the reflection color band that may occur due to a step in one anode will be described.

Another embodiment is described in detail with reference to FIG. 9 and FIG. 10. First, a planar structure is described through FIG. 9.

Figure 9:
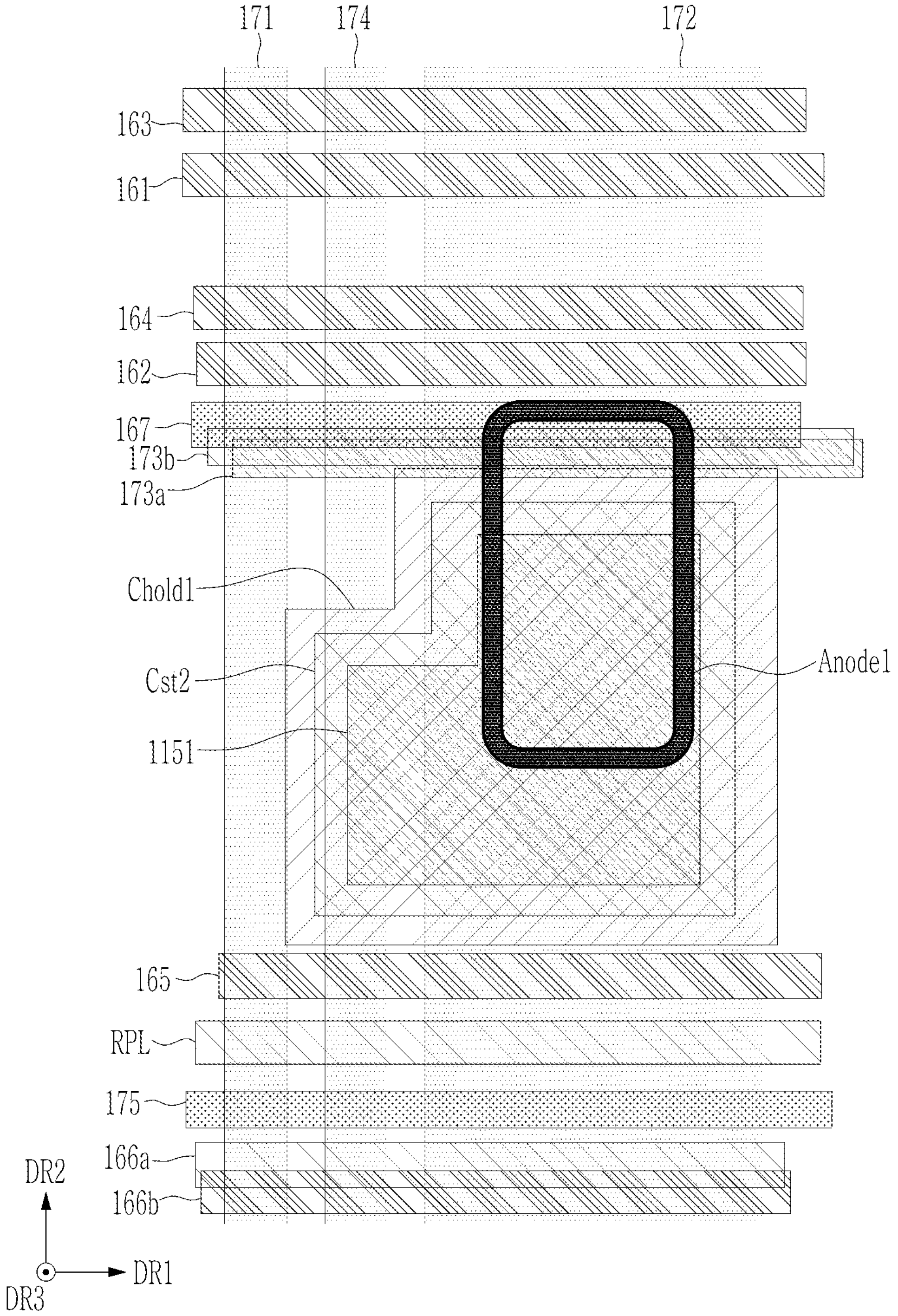
FIG. 9 is a view showing a planar structure of some conductive layers and an anode of a lower panel layer among a light emitting display device according to another embodiment.

FIG. 9 is also a view showing a planar structure of some conductive layers and an anode among lower panel layers of a light emitting display device according to another embodiment.

FIG. 9 corresponds to FIG. 5 and does not show a substrate 110, a buffer layer 111, and each insulating layer (a first gate insulating layer 141, a second gate insulating layer 142, a first interlayer insulating layer 151, a second interlayer insulating layer 152, a third gate insulating layer 143, a third interlayer insulating layer 153, a first organic layer 181, a second organic layer 182, and a third organic layer 183) among each layer included in FIG. 4; additionally, an overlapping electrode BML, a first semiconductor layer ACT, an oxide semiconductor layer OACT, and a pixel definition layer 380 are not shown. Then, FIG. 9 shows a first gate conductive layer GAT1, a second gate conductive layer GAT2, an auxiliary conductive layer CMTL, a third gate conductive layer GAT3, a first data conductive layer SD1, a second data conductive layer SD2, and an anode Anode1. In FIG. 9, showing only the conductive layer as described above but omitting the overlapping electrode BML, the influence for the flat anode of the overlapping electrode BML, the first semiconductor layer ACT and the oxide semiconductor layer OACT is small in disposing each conductive layer.

Specifically, the following is a summary of which conductive layer each part shown in the embodiment of FIG. 9 is included in.

The first gate conductive layer GAT1 includes a driving gate electrode 1151 and a lower first initialization voltage line 173*a*, the second gate conductive layer GAT2 includes a repair line RPL, an upper first initialization voltage line 173*b*, a second storage electrode Cst2, and a lower fourth scan line 166*a*, the auxiliary conductive layer CMTL includes a first hold electrode Chold1, the third gate conductive layer GAT3 includes a second initialization voltage line 175 and a second/first scan line 167, the first data conductive layer SD1 includes a first scan line 161, a second scan line 162, a third scan line 163, a first light emission signal line 164, a second light emission signal line 165, and an upper fourth scan line 166*b*, and the second data conductive layer SD2 includes a data line 171, a driving voltage line 172, and a reference voltage line 174.

Among them, the data line 171, the driving voltage line 172, and the reference voltage line 174 included in the second data conductive layer SD2 extend in the second direction DR2.

On the other hand, the lower first initialization voltage line 173*a* included in the first gate conductive layer GAT1, the repair line RPL, the upper first initialization voltage line 173*b*, and the lower fourth scan line 166*a* included in the second gate conductive layer GAT2, the second initialization voltage line 175 and the second/first scan line 167 included in the third gate conductive layer GAT3, and the first scan line 161, the second scan line 162, the third scan line 163, the first light emission signal line 164, the second light emission signal line 165, and the upper fourth scan line 166*b* included in the first data conductive layer SD1 extend in the first direction DR1.

In addition, the driving gate electrode 1151 included in the first gate conductive layer GAT1, the second storage electrode Cst2 included in the second gate conductive layer GAT2, and the first hold electrode Chold1 included in the auxiliary conductive layer CMTL overlap each other, each has an island structure, and the storage capacitor Cst and the hold capacitor Chold are as described above.

In FIG. 9, the repair line RPL is included in the second gate conductive layer GAT2. According to another embodiment, the repair line RPL may not be included, and another wiring—for example, the driving low voltage line 179 or the bias voltage line 176—may be positioned in place of the repair line RPL.

FIG. 9 shows only one anode Anode1.

In FIG. 9, part of the first anode Anode1 overlaps a capacitor triple layer composed of the driving gate electrode 1151 included in the planar first gate conductive layer GAT1, the second storage electrode Cst2 included in the second gate conductive layer GAT2, and the first hold electrode Chold1 included in the auxiliary conductive layer CMTL on the plane. The overlapping of the overlapping electrode BML, the first semiconductor layer ACT, and the oxide semiconductor layer OACT is not shown in FIG. 9; additionally, the first anode Anode1 overlaps the driving voltage line 172, which is positioned on the second data conductive layer SD2 in its entirety.

Referring to FIG. 9, another part of the first anode Anode1 does not overlap the capacitor triple layer. Instead, it overlaps a triple overlapping wiring composed of the lower first initialization voltage line 173*a* positioned in the first gate conductive layer GAT1, the upper first initialization voltage line 173*b* included in the second gate conductive layer GAT2, and the second/first scan line 167 included in the third gate conductive layer GAT3 on a plane. The portion of the first anode Anode1 overlapping with the triple overlapping wiring may be a portion including one end of the first anode Anode1, on the embodiment of FIG. 9, and it may be a part including the end of the second direction DR2 of the first anode Anode1. The part of the first anode Anode1 that overlaps with the triple overlapping wiring also overlaps the driving voltage line 172 positioned on the second data conductive layer SD2.

As described above, the first anode Anode1 may be divided into a portion overlapping with the capacitor triple layer and a portion overlapping with triple overlapping wiring. Here, since the entirety of the first anode Anode1 overlaps the driving voltage line 172 and is positioned on the organic layers 181, 182, and 183, the conductive layer positioned under the organic layers 181, 182, and 183, and overlapping on a plane is different, but the first anode Anode1 may be formed with a constant height as a whole and have a flat characteristic.

Figure 10:
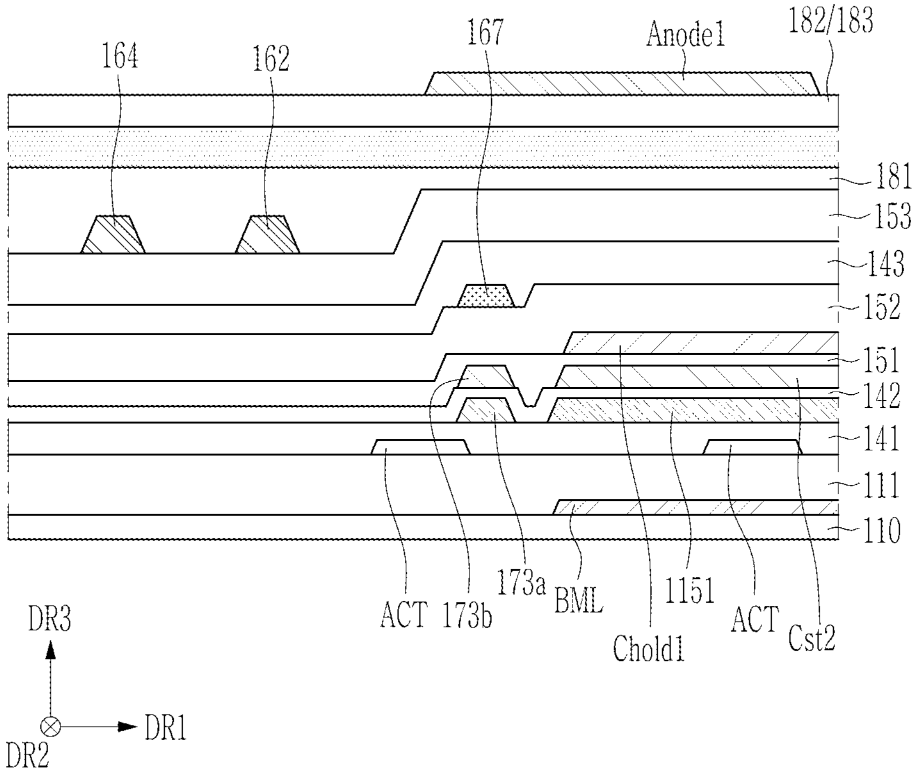
FIG. 10 is a cross-sectional view of a light emitting display device according to an embodiment of FIG. 9.

The height and flatness characteristics of the first anode Anode1 are described in more detail through FIG. 10.

FIG. 10 is a cross-sectional view of a light emitting display device according to an embodiment of FIG. 9.

FIG. 10 depicts a cross-sectional structure like FIG. 3, but shows a different perspective from FIG. 3 in that the lower layered structure of the first anode Anode1 is shown in detail.

Referring to FIG. 10, the lower layered structure of the first anode Anode1 is sequentially stacked from the substrate 110 as indicated below.

An overlapping electrode BML is positioned on a substrate 110, a buffer layer 111 is positioned on the overlapping electrode BML, a first semiconductor layer ACT is positioned on the buffer layer 111, a first gate insulating layer 141 is positioned on the first semiconductor layer ACT, a driving gate electrode 1151 and a lower first initialization voltage line 173*a* included in the first gate conductive layer GAT1 are positioned on the first gate insulating layer 141, a second gate insulating layer 142 is positioned on the first gate conductive layer GAT1, a second storage electrode Cst2 and an upper first initialization voltage line 173*b* included in the second gate conductive layer GAT2 are positioned on the second gate insulating layer 142, a first interlayer insulating layer 151 is positioned on the second gate conductive layer GAT2, a first hold electrode Chold1 included in the auxiliary conductive layer CMTL is positioned on the first interlayer insulating layer 151, a second interlayer insulating layer 152 is positioned on the auxiliary conductive layer CMTL, a third gate insulating layer 143 is positioned on the second interlayer insulating layer 152, a second/first scan line 167 included in the third gate conductive layer GAT3 is positioned on the third gate insulating layer 143, a third interlayer insulating layer 153 and a first organic layer 181 are sequentially positioned on the third gate conductive layer GAT3, a driving voltage line 172 positioned in the second data conductive layer SD2 is positioned on the first organic layer 181, a second organic layer 182 and a third organic layer 183 are sequentially positioned on the second data conductive layer SD2, and a first anode Anode1 is positioned on the third organic layer 183.

As shown in FIG. 10, a part of the first anode Anode1 overlaps the capacitor triple layer, but another part overlaps a triple overlapping wiring composed of the lower first initialization voltage line 173*a* positioned in the first gate conductive layer GAT1, the upper first initialization voltage line 173*b* included in the second gate conductive layer GAT2, and the second/first scan line 167 included in the third gate conductive layer GAT3. However, due to the organic layers 181, 182, and 183 positioned on top of the capacitor triple layer and the triple wiring, and the driving voltage line 172 positioned on the second data conductive layer SD2, the first anode Anode1 may be formed without a step and may have a flat characteristic.

Another comparative example of FIG. 11 and FIG. 12 will now be described, and the features of the embodiment of FIG. 9 and FIG. 10 will be described with reference to FIG. 11 and FIG. 12.

Figure 11:
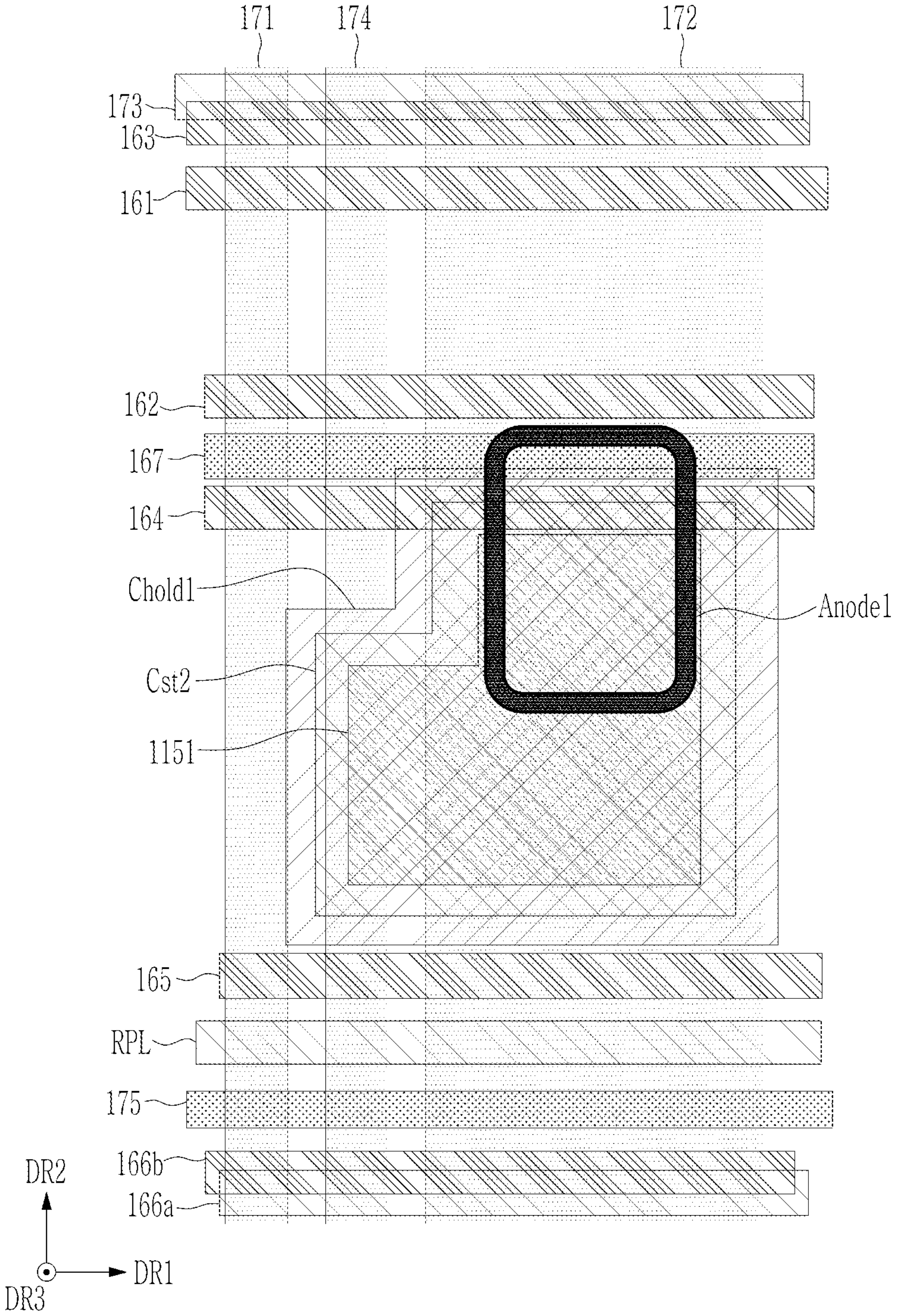
FIG. 11 is a view showing a planar structure of some conductive layers and an anode of a lower panel layer among a light emitting display device according to another comparative example.

FIG. 11 is a view showing a planar structure of some conductive layers and an anode among a lower panel layer of a light emitting display device according to another comparative example.

First, the planar structure of another comparative example is described through FIG. 11, and the explanation of the comparative example in FIG. 11 is described focusing on the parts that differ from FIG. 9.

In the comparative example of FIG. 11, a part of the first anode Anode1 overlaps the capacitor triple layer and the driving voltage line 172 as in FIG. 9.

However, the rest of the first anode Anode1, unlike FIG. 9, has a structure that does not overlap the triple overlapping wiring. In detail, in the comparative example of FIG. 11, the rest of the first anode Anode1 has a structure overlapping the second/first scan line 167 positioned in the third gate conductive layer GAT3 and the first light emission signal line 164 positioned in the first data conductive layer SD1, and the second/first scan line 167 and the first light emission signal line 164 are positioned apart from each other on a plane without overlapping each other.

Also, in the comparative example of FIG. 11, unlike FIG. 9, the first initialization voltage line 173 is formed only of the second gate conductive layer GAT2, has a single-layer structure, and is positioned on a portion that does not overlap the first anode Anode1.

Figure 12:
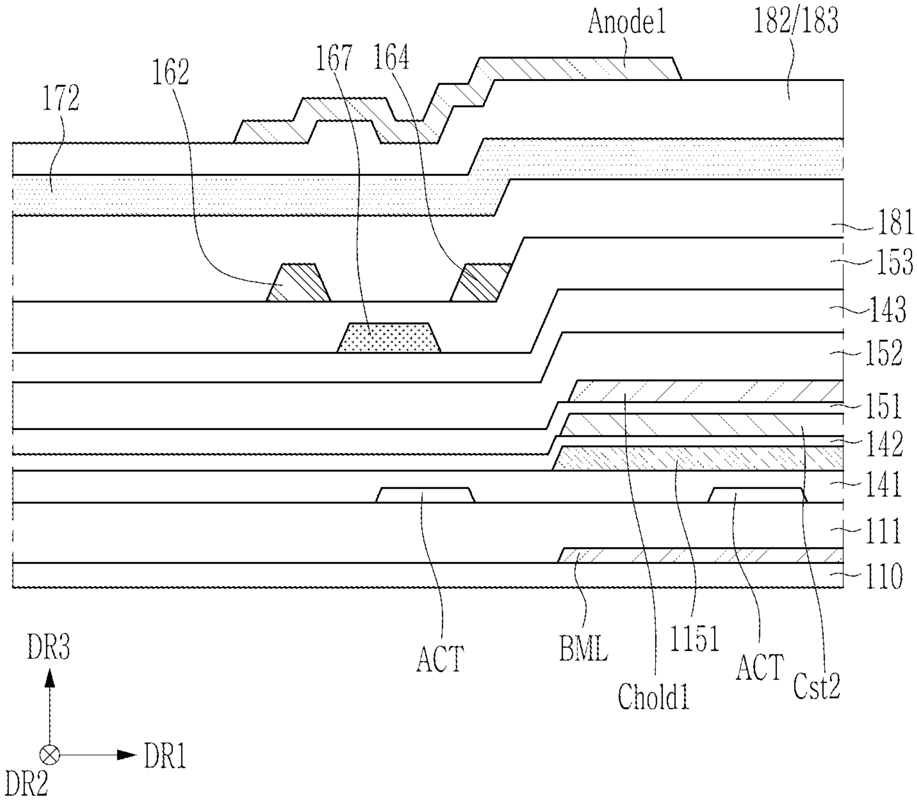
FIG. 12 is a cross-sectional view of a light emitting display device according to an embodiment of FIG. 11.

The comparative example of FIG. 11 may have a cross-sectional structure like FIG. 12.

FIG. 12 is a cross-sectional view of a light emitting display device according to an embodiment of FIG. 11.

In FIG. 12, the first anode Anode1 is not formed flat as a whole and the structure having a step is clearly shown.

In the comparative example of FIG. 12, the first anode Anode1 has a stepped structure. The first anode Anode1 has a step partly because the conductive layer under the first organic layer 181 overlapped with the first anode Anode1 does not have a planar top surface.

An overlapping electrode BML is positioned on a substrate 110, a buffer layer 111 is positioned on the overlapping electrode BML, a first semiconductor layer ACT is positioned on the buffer layer 111, a first gate insulating layer 141 is positioned on the first semiconductor layer ACT, a driving gate electrode 1151 included in a first gate conductive layer GAT1 is positioned on the first gate insulating layer 141, a second gate insulating layer 142 is positioned on the first gate conductive layer GAT1, a second storage electrode Cst2 included in a second gate conductive layer GAT2 is positioned on the second gate insulating layer 142, a first interlayer insulating layer 151 is positioned on the second gate conductive layer GAT2, a first hold electrode Chold1 included in an auxiliary conductive layer CMTL is positioned on the first interlayer insulating layer 151, a second interlayer insulating layer 152 is positioned on the auxiliary conductive layer CMTL, a third gate insulating layer 143 is positioned on the second interlayer insulating layer 152, a second/first scan line 167 included in a third gate conductive layer GAT3 is positioned on the third gate insulating layer 143, a third interlayer insulating layer 153 is positioned on the third gate conductive layer GAT3, a first light emission signal line 164 included in a first data conductive layer SD1 is positioned on the third interlayer insulating layer 153, a first organic layer 181 is positioned on the first data conductive layer SD1, a driving voltage line 172 included in a second data conductive layer SD2 is positioned on the first organic layer 181, a second organic layer 182 and a third organic layer 183 are sequentially positioned on the second data conductive layer SD2, and the first anode Anode1 is positioned on the third organic layer 183. Here, the second/first scan line 167 and the first light emission signal line 164 are positioned without overlapping each other.

That is, in the comparative example of FIG. 12, a portion of the first anode Anode1 overlaps the capacitor triple layer, a portion of the rest overlaps the second/first scan line 167 positioned in the third gate conductive layer GAT3, and another portion of the rest overlaps the first light emission signal line 164 positioned in the first data conductive layer SD1. Even if the first anode Anode1 overlaps with the driving voltage line 172 positioned on the second data conductive layer SD2, and the organic layers 181, 182, and 183 are present, there is a step in the first anode Anode1 because the conductive layer positioned below the first organic layer 181 creates a step, as shown in FIG. 12. Therefore, the first anode Anode1 according to the comparative example in FIG. 11 and FIG. 12 does not have a flat structure, but has a stepped structure.

If the first anode Anode1 having the step is included as in FIG. 11 and FIG. 12, when an external light is incident and reflected from the first anode Anode1, the difference in the length of the reflection path of the external light occurs depending on the point on the first anode Anode1 where reflection happens. As a result, the reflection color band occurs. This reflection color band may be visually recognized by the user, who sees a low display quality.

However, in the embodiment of FIG. 9 and FIG. 10, since the first anode Anode1 has a flat characteristic, regardless of which point on the first anode Anode1 the external light is reflected from, there is almost no difference in the reflection path. Avoiding large variation in the lengths of reflection paths prevents the reflection color band, keeping the display quality high.

In summary, FIG. 5 and FIG. 6 disclose an embodiment in which two anodes Anode1 and Anode2 are formed flat with the constant thickness has been described. FIG. 9 and FIG. 10 disclose an embodiment in which the first anode Anode1 is formed flat with constant thickness without the step.

When one pixel has two capacitors and each of the capacitors has the triple layer structure formed by overlapping three electrodes on a plane, at least part of the anode overlaps the capacitor triple layer on a plane. This structure creates 56ortep in the anode. For the anode to be formed flat and to have the constant thickness, parts of the anode that do not overlap the capacitor triple layer or a separate anode may also be formed to overlap with three conductive layers (the triple overlapping wiring). This way, the part of the anode above the capacitor triple layer and the part of the anode above the three conductive layers are at about the same height, avoiding a step in the anode.

However, according to an embodiment, since the organic layer may be positioned under the anode and the second data conductive layer SD2 may also be commonly positioned, the overlapping wiring may be formed with less than three conductive layers, and below, an embodiment in which the overlapping wiring is formed of two conductive layers is reviewed schematically with reference to FIG. 13.

Figure 13:
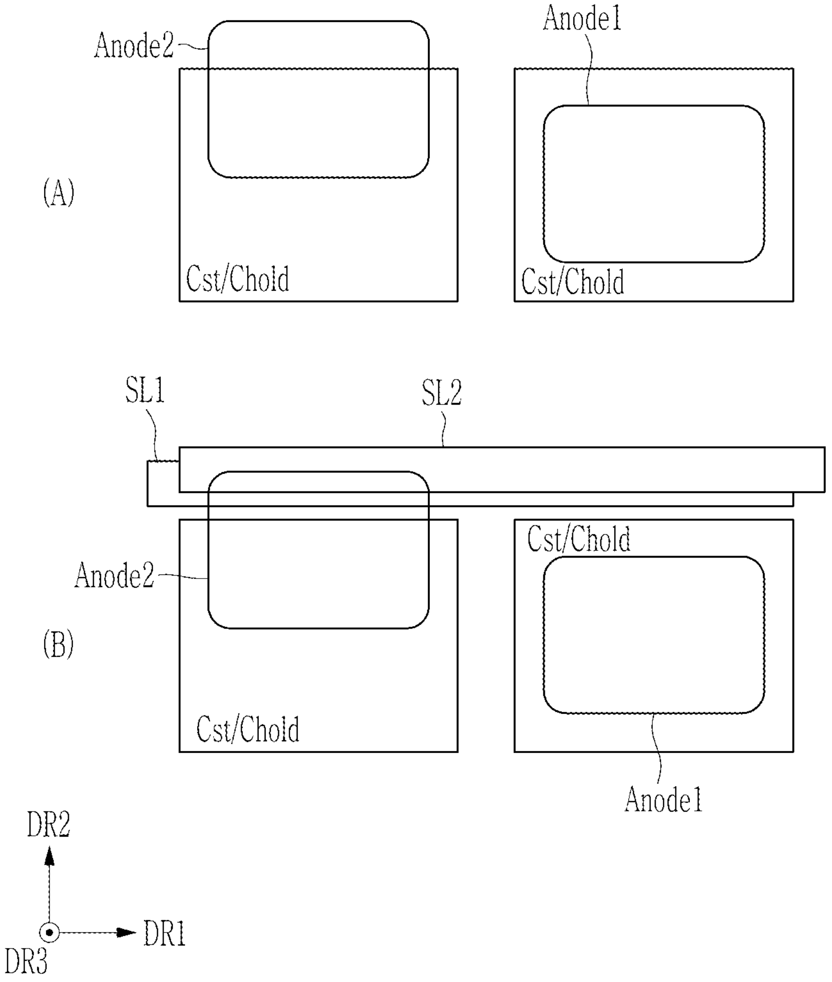
FIG. 13 is a view schematically comparing a structure of a comparative example and one embodiment.

FIG. 13 schematically compares the structure of a comparative example and one embodiment. FIG. 13(A) schematically shows a comparative example, and FIG. 13(B) schematically shows an embodiment of the disclosure.

In FIG. 13, unlike the previous drawing, the anodes Anode1 and Anode2 are shown and the capacitor triple layers Cst/Chold are briefly shown. Additionally, FIG. 13(B) shows the double overlapping wiring SL1 and SL2. In FIG. 13, the capacitor triple layer Cst/Chold is shown as a single layer but in reality, as disclosed above, the capacitor triple layer Cst/Chold has a structure in which three conductive layers are overlapped.

In the comparative example of FIG. 13(A), the first anode Anode1 can have a flat structure because the entire first anode Anode1 is on the capacitor triple layer Cst/Chold. However, less than all of the second anode Anode2 is on the capacitor triple layer Cst/Chold. For the second anode Anode2, a first part is on the capacitor triple layer Cst/Chold, and a second part is not on the planar capacitor triple layer Cst/Chold, as shown in FIG. 12. The height difference between the first part and the second part results in the second anode Anode2 having a step. The step causes a difference in the length of the reflection path of an external light, which in turn causes the reflection color band and display degradation.

In, FIG. 13(B), the first anode Anode1 may have the flat structure because the entire first anode Anode1 overlaps with the planar capacitor triple layer Cst/Chold, similarly to in the embodiment of FIG. 13(A). Similarly to the embodiment of FIG. 13(A), less than all of the second anode Anode2 is above the capacitor triple layer Cst/Chold. However, unlike the embodiment of FIG. 13(A), the part of the second anode Anode2 that does not overlap the capacitor triple layer Cst/Chold overlaps with the double overlapping wiring SL1 and SL2, and as shown in FIG. 10. As the thicknesses of the wiring SL1 and SL2 are selected to form a planar surface with the triple layer Cst/Chold, the second anode Anode2 may have the flat characteristic as in FIG. 6. Moreover, the first anode Anode1 and the second anode Anode2 may be formed with the same height. There should be almost no difference in the reflection path of the external light, and as a result, the display quality is improved because the reflection color band does not occur.

For reference, in the comparative example of FIG. 13(A), the second anode Anode2 may cause the step difference of about 2800 Å, but in the embodiment of FIG. 13(B), the second anode Anode2 may cause the step difference of less than 1500 Å, and the step difference may be reduced to 500 Å by optimizing the thickness. Therefore, in the present disclosure, an anode being "flat" indicates a case in which the height difference between the highest and the lowest parts of the anode is 500 Å or more and 1500 Å or less.

In the embodiment of FIG. 13(B), the double overlapping wiring SL1 and SL2 may be positioned in conductive layers different from each other among the first gate conductive layer GAT1, the second gate conductive layer GAT2, the auxiliary conductive layer CMTL, the third gate conductive layer GAT3, and the first data conductive layer SD1 in FIG. 4. In addition, the first overlapping wiring SL1 may be positioned in the conductive layer closer to the substrate 110 than the second overlapping wiring SL2, and the second overlapping wiring SL2 may be positioned in the conductive layer closer to the anodes Anode1 and Anode2. In addition, the double overlapping wirings SL1 and SL2 are layers positioned between the substrate 110 and the organic layers 181, 182, and 183, and may be positioned in the conductive layer excluding the semiconductor layer.

In the embodiment of FIG. 13(B), the first overlapping wiring SL1 and the second overlapping wiring SL2 may each be one of a scan line for transmitting a scan signal, a light emission signal line for transmitting a light emission signal, a voltage line for applying a certain voltage, or a repair line for repairing. In a case of the pixel according to the embodiment of FIG. 1, the first overlapping wiring SL1 and the second overlapping wiring SL2 may each be one of a first scan line 161 to which the first scan signal GW is applied, a second scan line 162 to which the second scan signal GC is applied, a second/first scan line 167 to which the second/first scan signal GC2 corresponding to the second scan signal GC is applied, a third scan line 163 to which the third scan signal GI is applied, light emission signal lines 164 and 165 to which the light emission signals EM1 and EM2 are applied, a fourth scan line 166 to which the fourth scan signal EB is applied, a driving voltage line 172, a driving low-voltage line 179, a first initialization voltage line 173, a second initialization voltage line 175, a reference voltage line 174, a bias voltage line 176, and a repair line RPL. Also, according to an embodiment, the first overlapping wiring SL1 and the second overlapping wiring SL2, for example like the lower second initialization voltage line 175*a* and the upper second initialization voltage line 175*b* of the embodiment of FIG. 5, may be a wiring having a double layered structure and applying the same signal or voltage.

The planar structure and cross-sectional structure shown in FIG. 5 to FIG. 13, according to an embodiment, may not have the pixel circuit of FIG. 1, and may include a structure in which two capacitors overlap. In addition, the overlapping wiring overlapping the anode may be various other wiring or conductive layers. However, it may not be a wiring in which the semiconductor layer is made conductive.

While this disclosure has been described in connection with what is presently considered to be practical exemplary embodiments, it is to be understood that the inventive concept is not limited to the disclosed embodiments. On the contrary, the disclosure is intended to cover various modifications and equivalent arrangements included within the spirit and scope of the appended claims.

What is claimed is:

1. A light emitting display device comprising:
a substrate;
a first anode and a second anode positioned on the substrate;
a plurality of conductive layers, at least one semiconductor layer, and a plurality of insulating layers positioned between the substrate and the first anode and between the substrate and the second anode,
wherein the plurality of conductive layers includes a capacitor triple layer, a first overlapping wiring, and a second overlapping wiring,
the first overlapping wiring and the second overlapping wiring overlap at least partially,
at least a portion of the first anode overlaps the capacitor triple layer, and
a first portion of the second anode overlaps the first overlapping wiring and the second overlapping wiring.

2. The light emitting display device of claim 1, wherein:
the plurality of conductive layers, the at least one semiconductor layer, and the plurality of insulating layers include:
a first semiconductor layer positioned on the substrate;
a first gate insulating layer positioned on the first semiconductor layer;

a first gate conductive layer positioned on the first gate insulating layer;
a second gate insulating layer positioned on the first gate conductive layer;
a second gate conductive layer positioned on the second gate insulating layer;
a first interlayer insulating layer positioned on the second gate conductive layer;
an auxiliary conductive layer positioned on the first interlayer insulating layer;
a second interlayer insulating layer positioned on the auxiliary conductive layer;
an oxide semiconductor layer positioned on the second interlayer insulating layer;
a third gate insulating layer positioned on the oxide semiconductor layer;
a third gate conductive layer positioned on the third gate insulating layer;
a third interlayer insulating layer positioned on the third gate conductive layer;
a first data conductive layer positioned on the third interlayer insulating layer;
a first organic layer positioned on the first data conductive layer;
a second data conductive layer positioned on the first organic layer; and
a second organic layer positioned on the second data conductive layer.

3. The light emitting display device of claim 2, wherein:
the capacitor triple layer includes:
a driving gate electrode included in the first gate conductive layer;
a second storage electrode included in the second gate conductive layer, and
a first hold electrode included in the auxiliary conductive layer, and
at least a part of the driving gate electrode, at least a part of the second storage electrode, and at least a part of the first hold electrode overlap each other.

4. The light emitting display device of claim 3, wherein:
the first anode and the second anode overlap with the second data conductive layer.

5. The light emitting display device of claim 4, wherein:
the first anode and the second anode overlap with a driving voltage line positioned in the second data conductive layer.

6. The light emitting display device of claim 5, wherein:
the first overlapping wiring is positioned in one conductive layer among the first gate conductive layer, the second gate conductive layer, the auxiliary conductive layer, the third gate conductive layer, and the first data conductive layer, and
the second overlapping wiring is positioned in a conductive layer different from the first overlapping wiring as one conductive layer among the first gate conductive layer, the second gate conductive layer, the auxiliary conductive layer, the third gate conductive layer, and the first data conductive layer.

7. The light emitting display device of claim 6, wherein:
the plurality of conductive layers further includes a third overlapping wiring,
the third overlapping wiring overlaps the first overlapping wiring and the second overlapping wiring at least partially,
the third overlapping wiring is one conductive layer among the first gate conductive layer, the second gate conductive layer, the auxiliary conductive layer, the third gate conductive layer, and the first data conductive layer, and is positioned in a conductive layer different from the first overlapping wiring and the second overlapping wiring.

8. The light emitting display device of claim 7, wherein:

the first overlapping wiring is a repair line positioned in the second gate conductive layer, the second overlapping wiring is a lower second initialization voltage line positioned in the auxiliary conductive layer, and the third overlapping wiring is an upper second initialization voltage line positioned in the third gate conductive layer.

9. The light emitting display device of claim 8, wherein:

the plurality of conductive layers further include a fourth overlapping wiring, a fifth overlapping wiring, and a sixth overlapping wiring, the fourth overlapping wiring, the fifth overlapping wiring, and the sixth overlapping wiring overlap each other at least partially, and a second portion of the second anode overlaps with the fourth overlapping wiring, the fifth overlapping wiring, and the sixth overlapping wiring.

10. The light emitting display device of claim 9, wherein:

the fourth overlapping wiring is a third scan line positioned in the first gate conductive layer, the fifth overlapping wiring is a first initialization voltage line positioned in the second gate conductive layer, and the sixth overlapping wiring is a first scan line positioned in the third gate conductive layer.

11. The light emitting display device of claim 7, wherein:

the first overlapping wiring is a third scan line positioned in the first gate conductive layer, the second overlapping wiring is a first initialization voltage line positioned in the second gate conductive layer, and the third overlapping wiring is a first scan line positioned in the third gate conductive layer.

12. A light emitting display device comprising:

a substrate;

a first anode positioned on the substrate; and a plurality of conductive layers, at least one semiconductor layer, and a plurality of insulating layers positioned between the substrate and the first anode, wherein the plurality of conductive layers includes a capacitor triple layer, a first overlapping wiring, and a second overlapping wiring, the first overlapping wiring and the second overlapping wiring overlap at least partially, the capacitor triple layer includes three conductive layers, and each of the three conductive layers of the capacitor triple layer is insulated from one another, a first portion of the first anode overlaps the capacitor triple layer, and a second portion of the first anode overlaps the first overlapping wiring and the second overlapping wiring.

13. A light emitting display device comprising:

a substrate;

a first anode positioned on the substrate; and a plurality of conductive layers, at least one semiconductor layer, and a plurality of insulating layers positioned between the substrate and the first anode, wherein the plurality of conductive layers includes a capacitor triple layer, a first overlapping wiring, and a second overlapping wiring, the first overlapping wiring and the second overlapping wiring overlap at least partially, a first portion of the first anode overlaps the capacitor triple layer, a second portion of the first anode overlaps the first overlapping wiring and the second overlapping wiring, and wherein the plurality of conductive layers, the at least one semiconductor layer, and the plurality of insulating layers include:

a first semiconductor layer positioned on the substrate;

a first gate insulating layer positioned on the first semiconductor layer;

a first gate conductive layer positioned on the first gate insulating layer;

a second gate insulating layer positioned on the first gate conductive layer;

a second gate conductive layer positioned on the second gate insulating layer;

a first interlayer insulating layer positioned on the second gate conductive layer;

an auxiliary conductive layer positioned on the first interlayer insulating layer;

a second interlayer insulating layer positioned on the auxiliary conductive layer;

an oxide semiconductor layer positioned on the second interlayer insulating layer;

a third gate insulating layer positioned on the oxide semiconductor layer;

a third gate conductive layer positioned on the third gate insulating layer;

a third interlayer insulating layer positioned on the third gate conductive layer;

a first data conductive layer positioned on the third interlayer insulating layer;

a first organic layer positioned on the first data conductive layer;

a second data conductive layer positioned on the first organic layer; and a second organic layer positioned on the second data conductive layer.

14. The light emitting display device of claim 13, wherein the capacitor triple layer includes:

a driving gate electrode included in the first gate conductive layer;

a second storage electrode included in the second gate conductive layer; and a first hold electrode included in the auxiliary conductive layer, wherein at least a portion of the driving gate electrode, at least a portion of the second storage electrode, and at least a portion of the first hold electrode overlap each other.

15. The light emitting display device of claim 14, wherein:

an entirety of the first anode overlaps the second data conductive layer.

16. The light emitting display device of claim 15, wherein:

an entirety of the first anode overlaps a driving voltage line located in the second data conductive layer.

17. The light emitting display device of claim 16, wherein:

the first overlapping wiring is positioned in a conductive layer among the first gate conductive layer, the second gate conductive layer, the auxiliary conductive layer, the third gate conductive layer, and the first data conductive layer, and the second overlapping wiring is a conductive layer among the first gate conductive layer, the second gate conductive layer, the auxiliary conductive layer, the third gate conductive layer, and the first data conductive layer, and is positioned in a conductive layer different from the first overlapping wiring.

18. The light emitting display device of claim 17, wherein:

the plurality of conductive layers further includes a third overlapping wiring, the third overlapping wiring overlaps the first overlapping wiring and the second overlapping wiring at least partially, and the third overlapping wiring is a conductive layer among the first gate conductive layer, the second gate conductive layer, the auxiliary conductive layer, the third gate conductive layer, and the first data conductive layer, and is positioned in a conductive layer different from the first overlapping wiring and the second overlapping wiring.

19. The light emitting display device of claim 18, wherein:

two of the first overlapping wiring, the second overlapping wiring, and the third overlapping wiring receive the same voltage or signal.

20. The light emitting display device of claim 19, wherein:

the first overlapping wiring is a lower first initialization voltage line positioned in the first gate conductive layer, the second overlapping wiring is an upper first initialization voltage line positioned in the second gate conductive layer, and the third overlapping wiring is a second/first scan line positioned in the third gate conductive layer.

* * * * *